United States Patent
Yamaguchi

(10) Patent No.: US 9,947,715 B2
(45) Date of Patent: Apr. 17, 2018

(54) MANUFACTURING METHOD OF SEMICONDUCTOR DEVICE

(71) Applicant: Renesas Electronics Corporation, Kawasaki-shi, Kanagawa (JP)

(72) Inventor: Tadashi Yamaguchi, Kanagawa (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 150 days.

(21) Appl. No.: 14/729,226

(22) Filed: Jun. 3, 2015

(65) Prior Publication Data

US 2015/0357370 A1    Dec. 10, 2015

(30) Foreign Application Priority Data

Jun. 4, 2014 (JP) ................. 2014-116029

(51) Int. Cl.
*H01L 27/146* (2006.01)
*H01L 21/311* (2006.01)
*H01L 21/306* (2006.01)
*H01L 21/02* (2006.01)

(52) U.S. Cl.
CPC .. *H01L 27/14689* (2013.01); *H01L 21/30604* (2013.01); *H01L 21/31116* (2013.01); *H01L 27/1462* (2013.01); *H01L 27/14603* (2013.01); *H01L 27/14612* (2013.01); *H01L 27/14643* (2013.01); *H01L 21/02238* (2013.01)

(58) Field of Classification Search
CPC ............. H01L 25/4167; H01L 27/3227; H01L 27/14643
See application file for complete search history.

(56) References Cited

U.S. PATENT DOCUMENTS

| | | | |
|---|---|---|---|
| 5,284,549 A | * | 2/1994 | Barnes .................... C03C 15/00 216/67 |
| 8,525,909 B2 | | 9/2013 | Matsumoto et al. |
| 8,987,041 B2 | | 3/2015 | Tomita et al. |
| 2005/0101070 A1 | | 5/2005 | Tsujiuchi et al. |
| 2007/0267658 A1 | * | 11/2007 | Song ................ H01L 27/14609 257/211 |

(Continued)

FOREIGN PATENT DOCUMENTS

JP    62-183179 A    8/1987
JP    06-069168 A    11/1994

(Continued)

OTHER PUBLICATIONS

Office Action, dated Jul. 18, 2017, in Japanese Patent Application No. 2014-116029.

*Primary Examiner* — Jay C Chang
*Assistant Examiner* — Mikka Liu
(74) *Attorney, Agent, or Firm* — Shapiro, Gabor and Rosenberger, PLLC

(57) ABSTRACT

The present invention makes it possible to improve the performance of a semiconductor device.
After anisotropic etching is applied to an insulating film covering a gate electrode of a transfer transistor and a sidewall spacer is formed over the sidewall of the gate electrode, a damaged layer formed in the interior of a semiconductor substrate by the anisotropic etching is removed by oxidizing the surface of the semiconductor substrate, forming a sacrificial oxide film, and removing the sacrificial oxide film.

20 Claims, 24 Drawing Sheets

(56) References Cited

U.S. PATENT DOCUMENTS

2009/0225209 A1* 9/2009 Arakawa ........... H01L 27/14609
348/306
2010/0026866 A1* 2/2010 Matsumoto ....... H01L 27/14609
348/308
2012/0329201 A1* 12/2012 Tomita .............. H01L 27/14812
438/73

FOREIGN PATENT DOCUMENTS

| JP | 07-022338 A | 1/1995 |
|---|---|---|
| JP | 08-250463 A | 9/1996 |
| JP | 2005-142319 A | 6/2005 |
| JP | 2006-059842 A | 3/2006 |
| JP | 2008-060383 A | 3/2008 |
| JP | 2010-056515 A | 3/2010 |
| JP | 2013-008782 A | 1/2013 |

* cited by examiner

MANUFACTURING METHOD OF SEMICONDUCTOR DEVICE

CROSS-REFERENCE TO RELATED APPLICATIONS

The disclosure of Japanese Patent Application No. 2014-116029 filed on Jun. 4, 2014 including the specification, drawings and abstract is incorporated herein by reference in its entirety.

BACKGROUND

The present invention relates to a manufacturing method of a semiconductor device and can be used favorably for a manufacturing method of a semiconductor device including a solid-state image sensing device for example.

As a solid-state image sensing device, a solid-state image sensing device (CMOS image sensor) using a CMOS (Complementary Metal Oxide Semiconductor) has been developed. The CMOS image sensor is configured so as to include a plurality of pixels having photodiodes and transfer transistors.

In Japanese Unexamined Patent Application Publication No. 2005-142319 (Patent Literature 1), a technology of removing a metallic pollutant attaching to the bottom face of a trench is disclosed. According to the abstract, the temperature of a substrate is controlled to 200° C. to 600° C., excitation energy is given by plasma, and thus oxidation reaction is caused on the surface of a silicon film. As a result, a silicon oxide film is formed over the surface of the silicon film exposed in a trench. A metallic pollutant coheres at the interface between the silicon oxide film and the silicon film and comes to be metallic silicide. The silicon oxide film is removed by an HF system solution. In accordance with this, the metallic silicide is also removed.

In Japanese Unexamined Patent Application Publication No. 2008-60383 (Patent Literature 2), a technology that makes it possible to form a gate insulating film having a high reliability is disclosed. According to the abstract, after a groove is formed over the surface of a silicon substrate, the inner surface of the groove is cleaned to remove pollutants and successively a defective layer over the inner surface of the groove is removed by isotropic etching using a radical generated by ionizing a fluorine-contained gas and an oxygen gas at a substrate temperature of 200° C. or lower.

In Japanese Unexamined Patent Application Publication No. 2006-59842 (Patent Literature 3), a technology of inhibiting stress caused in a substrate by an element isolation (STI) section and mitigating the problem of joint leak current is disclosed. According to Example 3, a damaged layer formed inside a groove when the groove is formed in a silicon substrate by anisotropic dry etching is removed by isotropic etching.

CITATION LIST

Patent Literature

Patent Literature 1: Japanese Unexamined Patent Application Publication No. 2005-142319
Patent Literature 2: Japanese Unexamined Patent Application Publication No. 2008-060383
Patent Literature 3: Japanese Unexamined Patent Application Publication No. 2006-059842

SUMMARY

In a semiconductor device having a photodiode too, it is desirable to improve the performance to the greatest possible extent, for example to reduce dark-time white spots, dark-time white defects, and the like.

Other problems and novel features will be obvious from the descriptions and attached drawings in the present specification.

According to an embodiment, a damaged layer formed over a semiconductor substrate by anisotropic etching is removed by: applying anisotropic etching to an insulating film with which a gate electrode of a transfer transistor is covered; forming a sidewall spacer over the sidewall of the gate electrode on the drain side; thereafter forming a sacrificial oxide film over the semiconductor substrate surface; and removing the sacrificial oxide film.

According to an embodiment, it is possible to improve the performance of a semiconductor device.

DETAILED DESCRIPTION

Figure 1:
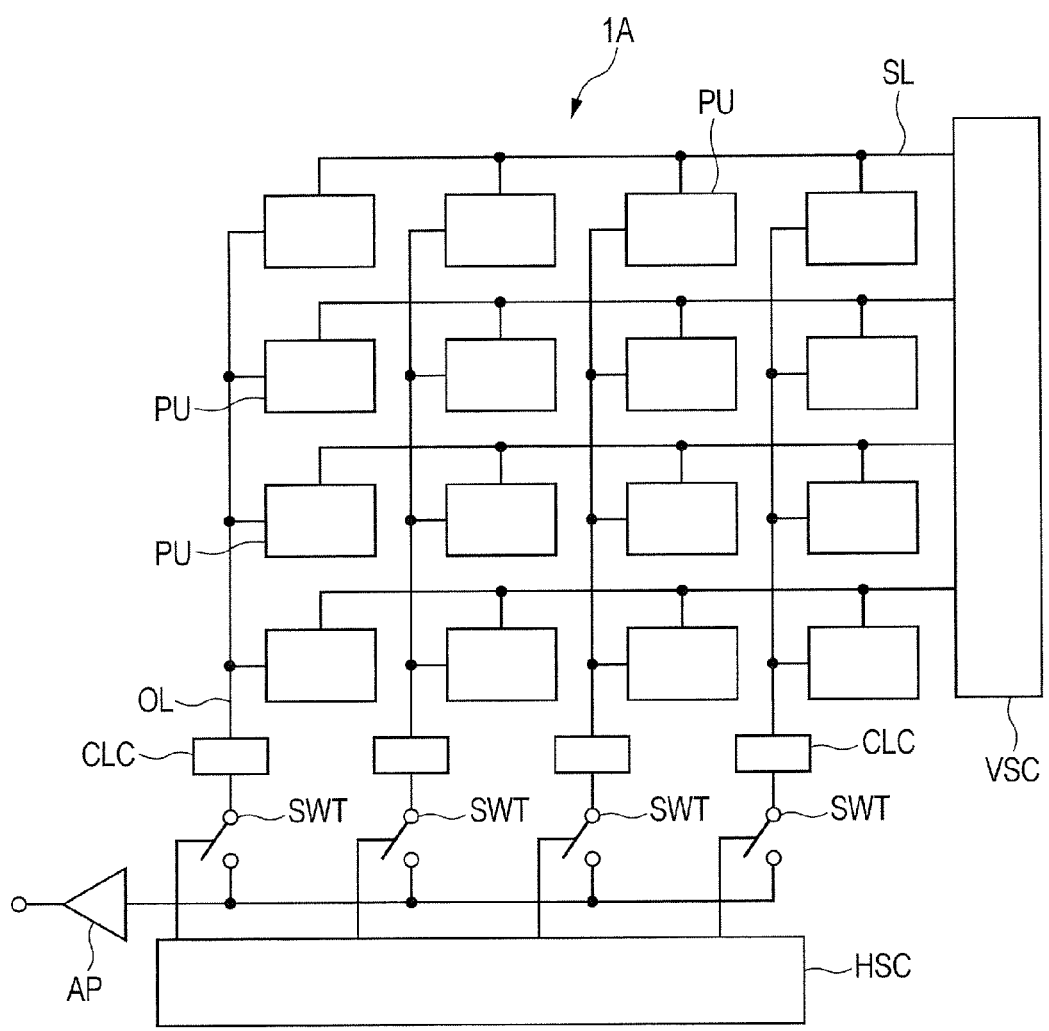
FIG. 1 is a circuit block diagram showing a configuration example of a semiconductor device according to an embodiment.

In the following embodiments, if necessary for convenience sake, each of the embodiments is explained by dividing it into plural sections or embodiments but, unless otherwise specified, they are not unrelated to each other and are in the relationship of one being a modified example, a detail, a supplemental explanation, or the like of a part or the whole of another. Further in the following embodiments, when the number of elements and others (including the number of pieces, a numerical value, a quantity, a range, and others) are referred to, except the cases of being specified and being limited obviously to a specific number in principle and other cases, the number is not limited to a specific number and may be larger or smaller than the specific number. Furthermore in the following embodiments, it goes without saying that the constituent components (including a component step and others) are not necessarily essential except the cases of being specified and being obviously thought to be essential in principle and other cases. Likewise in the following embodiments, when a shape, positional relationship, and the like of a constituent component or the like are referred to, they substantially include those approximate or similar to the shape and the like except the cases of being specified and being obviously thought to be otherwise in principle and other cases. The same goes for the numerical value and the range.

Embodiments are hereunder explained in detail in reference to the drawings. Further, in all the drawings for explaining the embodiments, members having identical function are represented with an identical code and are not explained repeatedly. Further, in the following embodiments, identical or similar parts are not explained repeatedly in principle except when particularly needed.

Further, in the drawings used in the embodiments, hatching may sometimes be omitted even in a sectional view in order to make a drawing easy to understand. In reverse, hatching may sometimes be applied even in a plan view in order to make a drawing easy to understand.

Embodiment 1

The structure and the manufacturing processes of a semiconductor device according to Embodiment 1 are hereunder explained in detail in reference to drawings. In Embodiment 1, explanations are made on the basis of the case where a semiconductor device is a CMOS image sensor as a surface irradiation type image sensor that receives light from the surface side of a semiconductor substrate.

<Configuration of Semiconductor Device>

Figure 2:
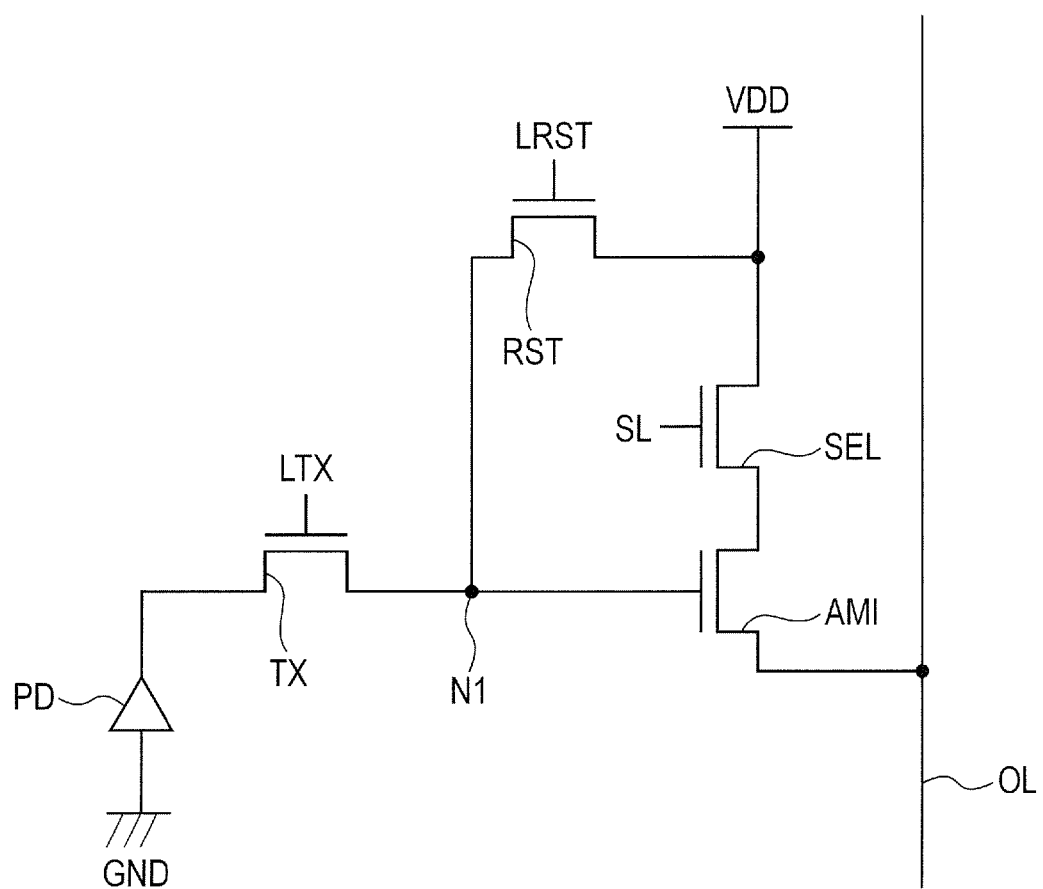
FIG. 2 is a circuit diagram showing a configuration example of a pixel.

FIG. 1 is a circuit block diagram showing a configuration example of a semiconductor device according to the present embodiment. FIG. 2 is a circuit diagram showing a configuration example of a pixel. Here, although 16 pixels arranged in an array (in a matrix) of 4 rows and 4 columns (4×4) are shown in FIG. 1, the number of the arrayed pixels is not limited to the number and can be changed variously and actually the number of pixels used in an electronic device such as a camera may sometimes be several millions for example.

A plurality of pixels PU are arranged in an array in a pixel region 1A shown in FIG. 1 and drive circuits including a vertical scanning circuit VSC and a horizontal scanning circuit HSC are arranged around the pixel region. Each pixel (cell, pixel unit) PU is arranged at the intersection of a selection line SL and an output line OL. The selection lines SL are coupled to the vertical scanning circuit VSC and the output lines OL are coupled to column circuits CLC respectively. The column circuits CLC are coupled to an output amplifier AP through switches SWT. The switches SWT are coupled to the horizontal scanning circuit HSC and controlled by the horizontal scanning circuit HSC.

For example, an electric signal read out from a pixel PU selected by the vertical scanning circuit VSC and the horizontal scanning circuit HSC is outputted through an output line OL and the output amplifier AP.

A pixel PU includes, as shown in FIG. 2 for example, a photodiode PD and four transistors RST, TX, SEL, and AMI. The transistors RST, TX, SEL, and AMI include n-channel type MISFETs (Metal Insulator Semiconductor Field Effect Transistors), respectively. The transistor RST is a reset transistor (transistor for reset), the transistor TX is a transfer transistor (transistor for transfer), the transistor SEL is a selection transistor (transistor for selection), and the transistor AMI is an amplification transistor (transistor for amplification). Here, the transfer transistor TX is a transfer transistor to transfer an electric charge generated by the photodiode PD. Further, besides those transistors, other transistors and elements including a capacitative element may sometimes be incorporated. Here, as the configurations of coupling those transistors, there are various kinds of modified and applied configurations.

In the circuit example shown in FIG. 2, the photodiode PD and the transfer transistor TX are coupled in series between a ground potential GND and a node N1. The reset transistor RST is coupled between the node N1 and an electric source potential (electric source potential line) VDD. The selection transistor SEL and the amplification transistor AMI are coupled in series between the electric source potential VDD and an output line OL. The gate electrode of the amplification transistor AMI is coupled to the node N1. Further, the gate electrode of the reset transistor RST is coupled to a reset line LRST. Furthermore, the gate electrode of the selection transistor SEL is coupled to a selection line SL and the gate electrode of the transfer transistor TX is coupled to a transfer line (second selection line) LTX.

For example, the transfer line LTX and the reset line LRST are activated (turned to an H level) and the transfer transistor TX and the reset transistor RST are turned on. As a result, the electric charge of the photodiode PD is discharged and depleted. Successively, the transfer transistor TX is turned off.

Successively, when a mechanical shutter of an electronic device such as a camera is opened for example, an electric charge is generated by incident light and accumulated at the photodiode PD during the opening of the shutter. In other words, the photodiode PD receives incident light and generates an electric charge.

Successively, after the shutter is closed, the reset line LRST is deactivated (turned to an L level) and the reset transistor RST is turned off. Further, the selection line SL and the transfer line LTX are activated ((turned to an H level) and the selection transistor SEL and the transfer transistor TX are turned on. As a result, the electric charge generated by the photodiode PD is transferred to an end of the transfer transistor TX on the node N1 side (corresponding to a floating diffusion FD in FIG. 3 which will be described later). On this occasion, the potential of the floating diffusion FD changes to a value conforming to the electric charge transferred from the photodiode PD and the value is amplified by the amplification transistor AMI and appears at the output line OL. The potential of the output line OL comes to be an electric signal (received-light signal) and is read out as an output signal from the output amplifier AP through a column circuit CLC and a switch SWT.

Figure 3:
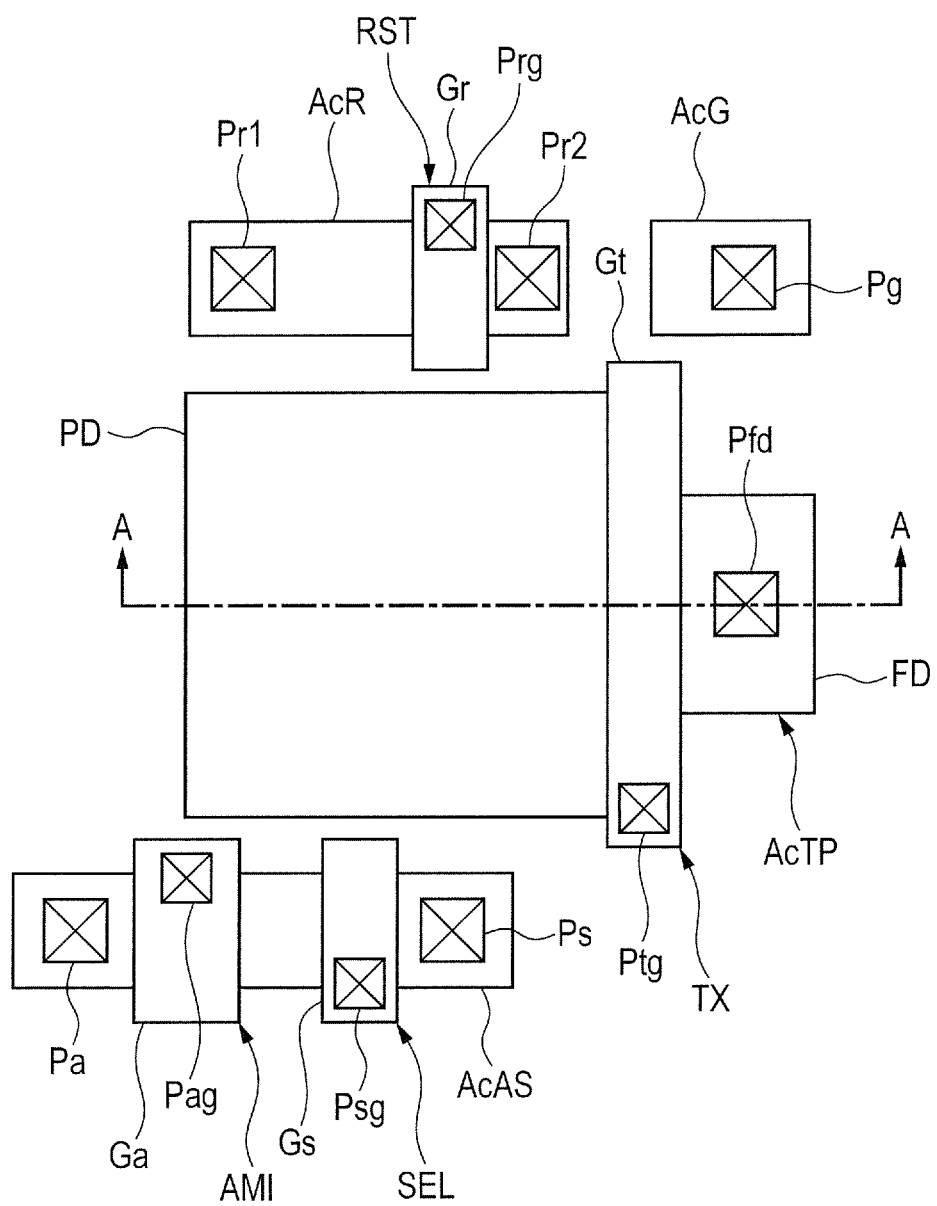
FIG. 3 is a plan view showing a pixel in a semiconductor device according to an embodiment.

FIG. 3 is a plan view showing a pixel in a semiconductor device according to the present embodiment.

As shown in FIG. 3, a pixel PU (refer to FIG. 1) in a semiconductor device according to the present embodiment has an active region AcTP where a photodiode PD and a transfer transistor TX are arranged and an active region AcR where a reset transistor RST is arranged. Further, the pixel PU has an active region AcAS where a selection transistor SEL and an amplification transistor AMI are arranged and an active region AcG where a plug Pg coupled to a ground potential line not shown in the figure is arranged.

A gate electrode Gr is arranged in the active region AcR and plugs Pr1 and Pr2 are arranged over a source/drain region on both the sides. The reset transistor RST includes the gate electrode Gr and the source/drain region.

A gate electrode Gt is arranged in the active region AcTP and, in a planar view, the photodiode PD is arranged on one side in both the sides of the gate electrode Gt and a floating diffusion FD is arranged on the other side. The photodiode PD is a PN-junction diode and include a plurality of n-type or p-type impurity diffusion regions (semiconductor regions) for example. Further, the floating diffusion FD has the function as a charge accumulation section or a floating diffusion layer and includes an n-type impurity diffusion region (semiconductor region) for example. A plug Pfd is arranged over the floating diffusion FD.

A gate electrode Ga and a gate electrode Gs are arranged in the active region AcAS, a plug Pa is arranged at the end of the active region AcAS on the gate electrode Ga side, and a plug Ps is arranged at the other end of the active region AcAS on the gate electrode Gs side. Both the sides of the gate electrode Ga and the gate electrode Gs are a source/drain region, and the selection transistor SEL and the amplification transistor AMI coupled in series include the gate electrode Ga, the gate electrode Gs, and the source/drain region.

The plug Pg is arranged above the active region AcG. The plug Pg is coupled to a ground potential line not shown in the figure. As a result, the active region AcG is a power feed region for applying a ground potential GND to the well region of the semiconductor substrate.

Meanwhile, a plug Prg, a plug Ptg, a plug Pag, and a plug Psg are arranged over the gate electrode Gr, the gate electrode Gt, the gate electrode Ga, and the gate electrode Gs, respectively.

The plugs Pr1, Pr2, Pg, Pfd, Pa, Ps, Prg, Ptg, Pag, and Psg are coupled with a plurality of wiring layers (for example, wires M1 to M3 shown in FIG. 6 described later) as necessary. As a result, the circuits shown in FIGS. 1 and 2 can be formed.

Figure 4:
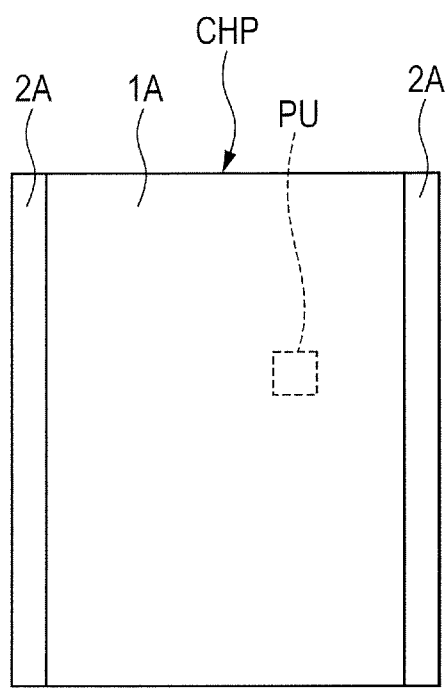
FIG. 4 is a plan view showing a chip region where a semiconductor device according to an embodiment is formed.

FIG. 4 is a plan view showing a chip region where a semiconductor device according to the present embodiment is formed. A chip region CHP has a pixel region 1A and a peripheral circuit region 2A and a plurality of pixels PU are arranged in a matrix in the pixel region 1A. A logic circuit is arranged in the peripheral circuit region 2A. The logic circuit computes an output signal outputted from the pixel region 1A and outputs image data on the basis of the computation result for example. Further, column circuits CLC, switches SWT, a horizontal scanning circuit HSC, a vertical scanning circuit VSC, an output amplifier AP, and others shown in FIG. 1 are also arranged in the peripheral circuit region 2A.

Figure 5:
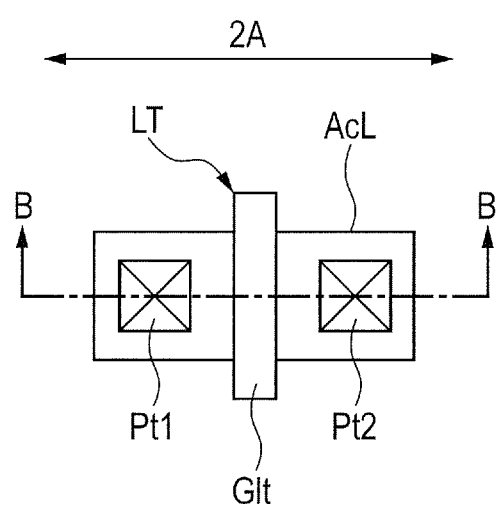
FIG. 5 is a plan view showing a transistor formed in a peripheral circuit region of a semiconductor device according to an embodiment.

FIG. 5 is a plan view showing a transistor formed in a peripheral circuit region 2A of a semiconductor device according to the present embodiment.

As shown in FIG. 5, a peripheral transistor LT as a logic transistor is arranged in a peripheral circuit region 2A. Although a plurality of n-channel type MISFETs and a plurality of p-channel type MISFETs are practically formed as transistors constituting a logic circuit in the peripheral circuit region 2A, one n-channel type MISFET in transistors constituting a logic circuit is shown as the peripheral transistor LT in FIG. 5.

As shown in FIG. 5, an active region AcL is formed in the peripheral circuit region 2A, a gate electrode Glt of the peripheral transistor LT is arranged in the active region AcL, and a source/drain region of the peripheral transistor LT including an $n^+$-type semiconductor region SD that will be described later is formed in the interior of the active region AcL on both the sides of the gate electrode Glt. Further, plugs Pt1 and Pt2 are arranged over the source/drain region of the peripheral transistor LT.

Although only one peripheral transistor LT is shown in FIG. 5, a plurality of transistors are practically arranged in the peripheral circuit region 2A. A logic circuit can be configured by coupling plugs over the source/drain regions or plugs over the gate electrodes Glt in the plural transistors with a plurality of wiring layers (wires M1 to M3 that will be described later). Further, an element other than a MISFET such as a capacitive element, a transistor of another configuration, or the like may sometimes be incorporated into a logic circuit.

Here, explanations are made hereunder on the basis of the case where a peripheral transistor LT is an n-channel type MISFET but the peripheral transistor LT may also be a p-channel type MISFET.

<Element Structure of Pixel Region and Peripheral Circuit Region>

Figure 6:
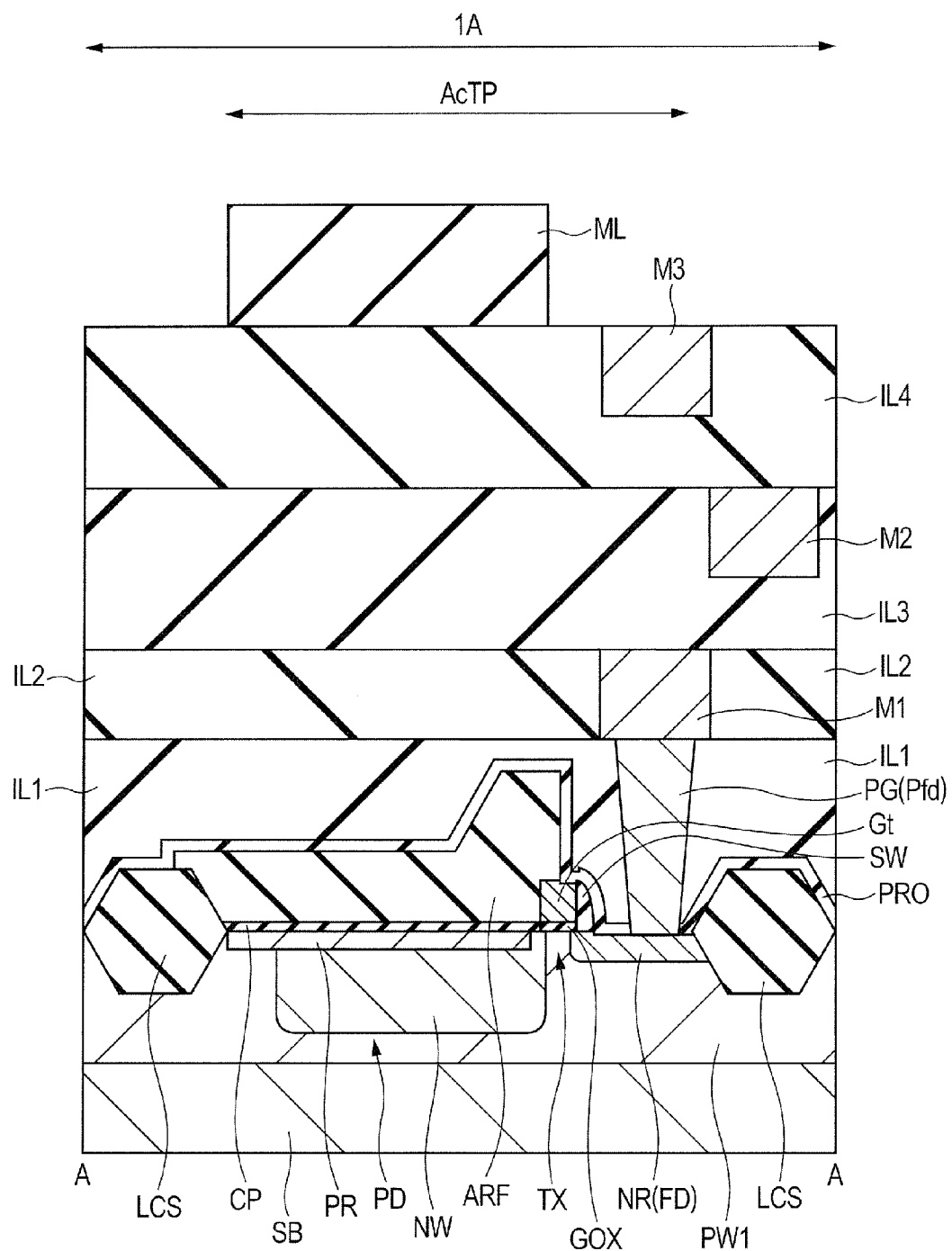
FIG. 6 is a sectional view showing a substantial part of a semiconductor device according to an embodiment.
Figure 7:
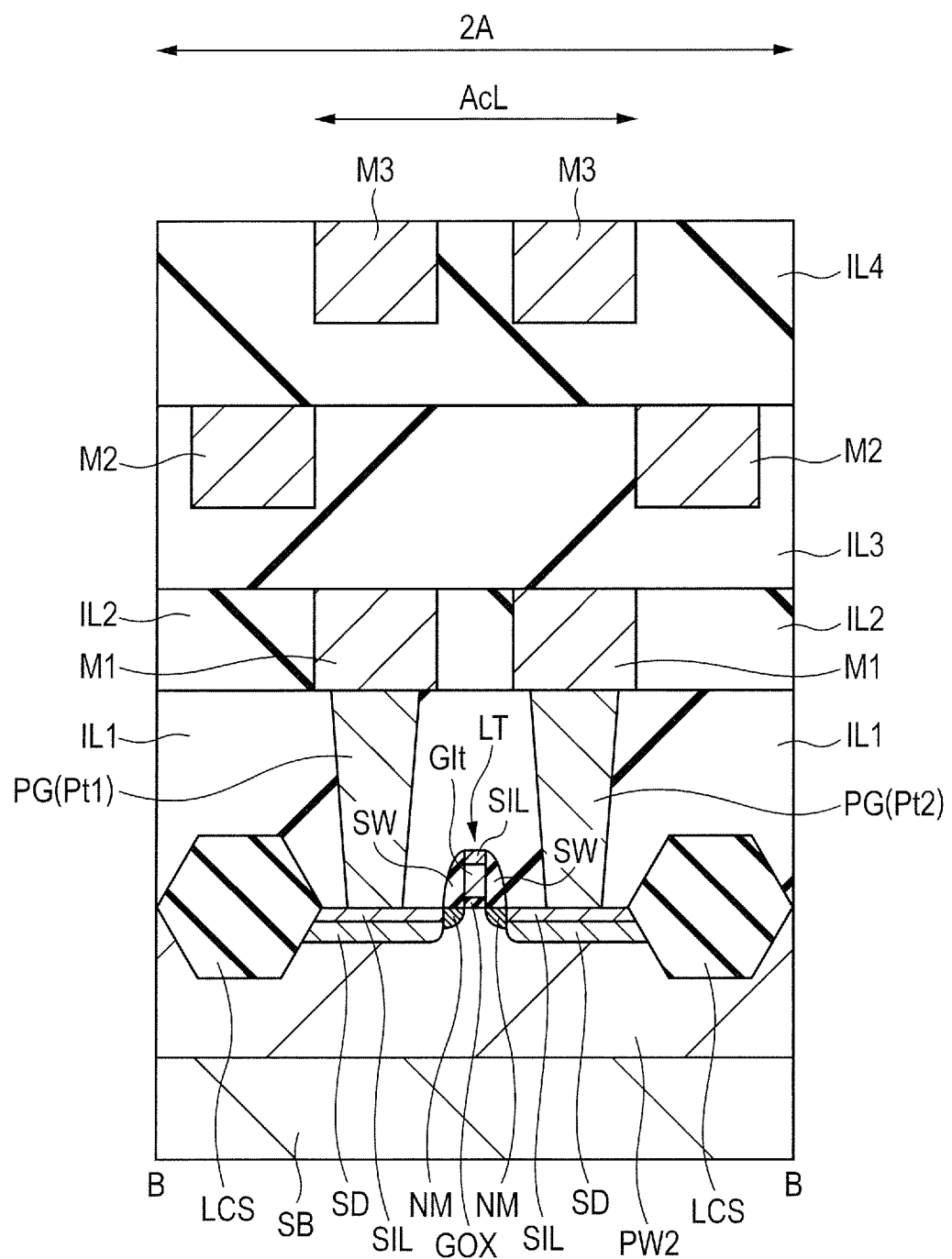
FIG. 7 is a sectional view showing a substantial part of a semiconductor device according to an embodiment.

The structure of a semiconductor device according to the present embodiment is hereunder explained in reference to the sectional views (FIGS. 6 and 7) of the semiconductor device according to the present embodiment. FIGS. 6 and 7 are sectional views showing the substantial parts of the semiconductor device according to the present embodiment and FIG. 6 corresponds roughly to a sectional view taken on line A-A in FIG. 3 and FIG. 7 corresponds roughly to a sectional view taken on line B-B in FIG. 5.

As shown in FIG. 6, a photodiode PD and a transfer transistor TX are formed in an active region AcTP in a pixel region 1A in a semiconductor substrate SB. The photodiode PD includes a p-type well PW1, an n-type semiconductor region (n-type well) NW, and a p$^+$-type semiconductor region PR, those being formed in the semiconductor substrate SB. Further as shown in FIG. 7, a peripheral transistor LT is formed in an active region AcL in a peripheral circuit region 2A in the semiconductor substrate SB.

The semiconductor substrate SB is a semiconductor substrate (semiconductor wafer) comprising an n-type monocrystal silicon or the like into which n-type impurities (donor) such as phosphorus (P) or arsenic (As) are introduced for example. As another case, the semiconductor substrate SB may also be a so-called epitaxial wafer. In the case of using an epitaxial wafer as the semiconductor substrate SB, the semiconductor substrate SB can be formed by growing an epitaxial layer including an n$^-$-type monocrystal silicon into which n-type impurities (for example, phosphorus (P)) are introduced over the principal surface of an n$^+$-type monocrystal silicon substrate into which n-type impurities (for example, arsenic (As)) are introduced, for example.

An element isolation region LCS including an insulator is arranged around the outer periphery of the active region AcTP. In this way, the exposed region of the semiconductor substrate SB surrounded by the element isolation region LCS comes to be active regions including the active regions AcTP, AcL, and the like.

P-type wells (p-type semiconductor regions) PW1 and PW2 are formed from the principal surface of the semiconductor substrate SB to a prescribed depth. The p-type well PW1 is formed over the whole active region AcTP. That is, the p-type well PW1 is formed over the region where the photodiode PD is formed and the region where the transfer transistor TX is formed. Further, the p-type well PW2 is formed over the whole active region AcL. That is, the p-type well PW2 is formed in the region where the peripheral transistor LT is formed. The p-type wells PW1 and PW2 are p-type semiconductor regions into which p-type impurities such as boron (B) are introduced, respectively. The p-type wells PW1 and PW2 are regions independent from each other and are also independent electrically.

As shown in FIG. 6, the n-type semiconductor region (n-type well) NW is formed so as to be embraced by the p-type well PW1 in the semiconductor substrate SB in the active region AcTP. The n-type semiconductor region NW is an n-type semiconductor region into which n-type impurities such as phosphorus (P) or arsenic (As) are introduced.

The n-type semiconductor region NW is an n-type semiconductor region for forming the photodiode PD and also is the source region of the transfer transistor TX. That is, the n-type semiconductor region NW is mainly formed in the region where the photodiode PD is formed but a part of the n-type semiconductor region NW is formed at a location overlapping planarly (in a planar view) with a gate electrode Gt of the transfer transistor TX. The n-type semiconductor region NW is formed so that the depth (of the bottom face) may be shallower than the depth (of the bottom face) of the p-type well PW1.

The p$^+$-type semiconductor region PR is formed at a part of the surface of the n-type semiconductor region NW. The p$^+$-type semiconductor region PR is a p$^+$-type semiconductor region into which p-type impurities such as boron (B) are introduced (doped) at a high concentration and the impurity concentration (p-type impurity concentration) of the p$^+$-type semiconductor region PR is higher than the impurity concentration (p-type impurity concentration) of the p-type well PW1. As a result, the electric conductivity of the p$^+$-type semiconductor region PR is higher than the electric conductivity of the p-type well PW1.

The depth (of the bottom face) of the p$^+$-type semiconductor region PR is shallower than the depth (of the bottom face) of the n-type semiconductor region NW. The p$^+$-type semiconductor region PR is formed mainly at the surface layer part (surface part) of the n-type semiconductor region NW. As a result, when viewed in the thickness direction of the semiconductor substrate SB, the n-type semiconductor region NW is in the state of existing under the p$^+$-type semiconductor region PR that is the uppermost layer and the p-type well PW1 is in the state of existing under the n-type semiconductor region NW.

Further, a part of the p$^+$-type semiconductor region PR touches the p-type well PW1 in the region where the n-type semiconductor region NW is not formed. That is, the p$^+$-type semiconductor region PR has a part right under which the n-type semiconductor region NW exists so as to touch the n-type semiconductor region NW and a part right under which the p-type well PW1 exists so as to touch the p-type well PW1.

A PN junction is formed between the p-type well PW1 and the n-type semiconductor region NW. Further, a PN junction is formed between the p$^+$-type semiconductor region PR and the n-type semiconductor region NW. The p-type well PW1 (p-type semiconductor region), the n-type semiconductor region NW, and the p$^+$-type semiconductor region PR constitute a photodiode (PN-junction diode) PD.

The p$^+$-type semiconductor region PR is a region formed for the purpose of inhibiting electrons from being generated on the basis of interface states formed abundantly over the surface of the semiconductor substrate SB. That is, in the surface region of the semiconductor substrate SB, it sometimes happens that electrons are generated by the influence of interface states even in the state of not being irradiated with light and dark current is caused to increase. To cope with that, it is possible to: form a p$^+$-type semiconductor region PR having positive holes (holes) as a majority carrier over the surface of an n-type semiconductor region NW having electrons as a majority carrier; thereby inhibit electrons from being generated in the state of not being irradiated with light; and inhibit dark current from increasing. The p$^+$-type semiconductor region PR therefore has the role of recombining the electrons gushing from the outermost surface of a photodiode with the holes in the p$^+$-type semiconductor region PR and decreasing the dark current.

The photodiode PD is a light receiving element. Otherwise, the photodiode PD can be regarded as a photoelectric conversion element. The photodiode PD has the function of photoelectrically converting incident light, thus generating an electric charge, and accumulating the generated electric charge and the transfer transistor TX plays the role as a switch when the electric charge accumulated in the photodiode PD is transferred from the photodiode PD.

Further, the gate electrode Gt is formed so as to overlap planarly with a part of the n-type semiconductor region NW. The gate electrode Gt is the gate electrode of the transfer transistor TX and is formed (arranged) over the semiconductor substrate SB with a gate insulating film GOX interposed. A sidewall spacer SW is formed as a sidewall insulating film over the sidewall of the gate electrode Gt.

In the semiconductor substrate SB (p-type well PW1) in the active region AcTP, the n-type semiconductor region NW is formed on one side in both the sides of the gate electrode Gt and an n-type semiconductor region NR is formed on the other side of the gate electrode Gt. The n-type semiconductor region NR is an n$^+$-type semiconductor region into which n-type impurities such as phosphorus (P) or arsenic (As) are introduced (doped) at a high concentration and is formed in the p-type well PW1. The n-type semiconductor region NR is a semiconductor region as a floating diffusion (floating diffusion layer) FD and also is the drain region of the transfer transistor TX.

The n-type semiconductor region NR functions as the drain region of the transfer transistor TX but can also be regarded as a floating diffusion (floating diffusion layer) FD. Further, the n-type semiconductor region NW is a constituent component of the photodiode PD but can function also as a semiconductor region for the source of the transfer transistor TX. That is, the source region of the transfer transistor TX is formed by the n-type semiconductor region NW. For the reason, the n-type semiconductor region NW and the gate electrode Gt desirably have such a positional relationship that a part (source side) of the gate electrode Gt overlaps planarly (in a planar view) with a part of the n-type semiconductor region NW. The n-type semiconductor region NW and the n-type semiconductor region NR are formed so as to be separated from each other with a channel forming region (corresponding to the substrate region right under the gate electrode Gt) of the transfer transistor TX interposed.

A cap insulating film CP is formed over the surface of the photodiode PD (refer to FIG. 3), namely over the surfaces of the n-type semiconductor region NW and the p$^+$-type semiconductor region PR. The cap insulating film CP is formed for keeping the surface characteristics, namely interface characteristics, of the semiconductor substrate SB well. An antireflection film ARF is formed over the cap insulating film CP. That is, the antireflection film ARF is formed over the n-type semiconductor region NW and the p$^+$-type semiconductor region PR with the cap insulating film CP interposed. A part (end) of the antireflection film ARF can also override the gate electrode Gt.

Meanwhile, as shown in FIG. 7, a gate electrode Glt of the peripheral transistor LT is formed over the p-type well PW2 in the active region AcL with a gate insulating film GOX interposed and sidewall spacers SW are formed over the sidewalls on both the sides of the gate electrode Glt. Further, the source/drain region of the peripheral transistor LT is formed in the p-type well PW2 on both the sides of the gate electrode Glt. The source/drain region of the peripheral transistor LT has an LDD (Lightly Doped Drain) structure and includes an n$^-$-type semiconductor region NM that is an n-type low concentration semiconductor region and an n$^+$-type semiconductor region SD that is an n-type high concentration semiconductor region. Furthermore, a metallic silicide layer SIL is formed over the surfaces of the gate electrode Glt of the peripheral transistor LT and the n$^+$-type semiconductor region SD constituting the source/drain region. In contrast, a metallic silicide layer SIL is not formed over the floating diffusion FD constituting the drain region of the transfer transistor TX constituting the pixel PU. Consequently, the surface of the floating diffusion FD is covered with a silicide block film PRO that will be described later. The silicide block film PRO includes a silicon oxide film for example. In the present embodiment, the whole area of the pixel region 1A is covered with the silicide block film PRO. In this regard however, the part that has to be covered with the silicide block film PRO is the floating diffusion FD of the transfer transistor TX where the metallic silicide layer SIL is not to be formed and the silicide block film PRO may not be formed at the other part.

An interlayer insulating film IL1 is formed over the semiconductor substrate SB so as to cover the gate electrode Gt, the antireflection film ARF, and the gate electrode Glt. The interlayer insulating film IL1 is formed over the whole principal surface of the semiconductor substrate SB including the pixel region 1A and the peripheral circuit region 2A. As described above, in the pixel region 1A, the surfaces of the gate electrode Gt, the antireflection film ARF, and the floating diffusion FD are covered with the silicide block film PRO and the interlayer insulating film IL1 is formed over the silicide block film PRO.

The interlayer insulating film IL1 includes a silicon oxide film formed by using TEOS (Tetra Ethyl Ortho Silicate) as a raw material for example. Electrically conductive plugs PG including the plugs Pr1, Pr2, Pg, Pfd, Pa, Ps, Prg, Ptg, Pag, Psg, Pt1, and Pt2 are embedded into the interlayer insulating film IL1. For example as shown in FIG. 6, the plug Pfd is formed as the plug PG over the n-type semiconductor region NR as the floating diffusion FD and the plug Pfd passes through the interlayer insulating film IL1, reaches the n-type semiconductor region NR, and is electrically coupled to the n-type semiconductor region NR.

The electrically conductive plugs PG including the plugs Pr1, Pr2, Pg, Pfd, Pa, Ps, Prg, Ptg, Pag, Psg, Pt1, and Pt2 are formed by embedding a barrier conductive film and a tungsten film formed over the barrier conductive film into contact holes formed in the interlayer insulating film IL1 for example. The barrier conductive film includes a laminated film of a titanium film and a titanium nitride film formed over the titanium film (namely a titanium/titanium nitride film) for example.

Although they are not shown in FIGS. 6 and 7, the reset transistor RST, the selection transistor SEL, and the amplification transistor AMI also have gate electrodes formed over the p-type well formed in the semiconductor substrate SB with a gate insulating film interposed and source/drain regions formed in the p-type well on both the sides of the gate electrodes (refer to FIG. 3). The selection transistor SEL and the amplification transistor AMI are coupled in series and hence they share the source/drain region on one side (refer to FIG. 3).

An interlayer insulating film IL2 is formed over the interlayer insulating film IL1 into which the plugs PG (Pr1, Pr2, Pg, Pfd, Pa, Ps, Prg, Ptg, Pag, Psg, Pt1, and Pt2) are embedded and a wire M1 is formed in the interlayer insulating film IL2 for example.

The interlayer insulating film IL2 includes a silicon oxide film for example but is not limited to the silicon oxide film and can also include a low permittivity film having a permittivity lower than the silicon oxide film. As the low permittivity film, an SiOC film is named for example.

The wire M1 includes a copper wire for example and can be formed by a damascene method. Here, the wire M1 is not limited to a copper wire and can also include an aluminum wire. When the wire M1 is an embedded copper wire (damascene copper wire) (FIGS. 6 and 7 correspond to this case), the embedded copper wire is embedded into a wiring gutter formed in the interlayer insulating film IL1 but, when the wire M1 is an aluminum wire, the aluminum wire is formed by patterning an electrically conductive film formed over the interlayer insulating film.

An interlayer insulating film IL3 including a silicon oxide film or a low permittivity film is formed over the interlayer insulating film IL2 in which the wire M1 is formed and a wire M2 is formed in the interlayer insulating film IL3 for example. Further, an interlayer insulating film IL4 is formed over the interlayer insulating film IL3 in which the wire M2 is formed and a wire M3 is formed in the interlayer insulating film IL4. The wires M1 to M3 constitute a wiring layer. The wires M1 to M3 are formed so as not to planarly overlap with the photodiode. The reason is to prevent the light entering the photodiode from being shielded by the wires M1 to M3.

Further, a microlens ML is mounted over the interlayer insulating film IL4 in which the wire M3 is formed. Here, a color filter may be installed between the microlens ML and the interlayer insulating film IL4.

In FIG. 6, when a pixel PU (refer to FIG. 1) is irradiated with light, firstly the incident light passes through the microlens ML. Successively, the light passes through the interlayer insulating films IL4 to IL1 that are transparent to visible light and thereafter enters the antireflection film ARF. The incident light is inhibited from reflecting by the antireflection film ARF and a sufficient quantity of the incident light enters the photodiode PD. At the photodiode PD, since the energy of the incident light is larger than the band gap of silicon, the incident light is absorbed by photoelectric conversion and positive hole electron pairs are generated. The electrons generated on the occasion are accumulated in the n-type semiconductor region NW. Then at an appropriate timing, the transfer transistor TX is turned on. Concretely, a voltage not lower than a threshold voltage is applied to the gate electrode Gt of the transfer transistor TX. As a result, a channel region is formed in a channel forming region right under the gate insulating film GOX of the transfer transistor TX and the n-type semiconductor region NW as the source region of the transfer transistor TX and the n-type semiconductor region NR as the drain region of the transfer transistor TX conduct electrically. As a result, the electrons accumulated in the n-type semiconductor region NW reach the drain region (n-type semiconductor region NR) through the channel region and are transferred and taken out from the drain region (n-type semiconductor region NR) to an external circuit through the plug Pfd and the wiring layer.

<Manufacturing Method of Semiconductor Device>

Figure 28:
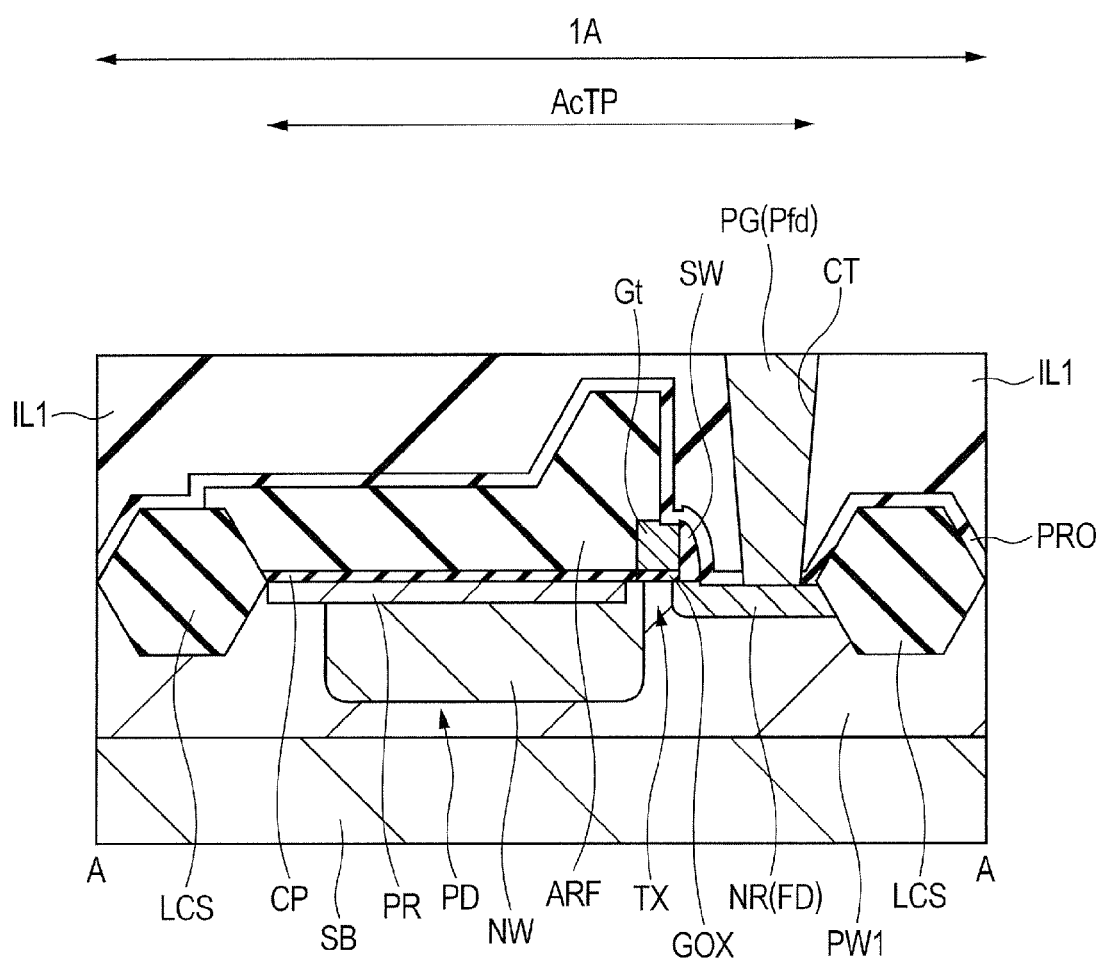
FIG. 28 is a sectional view showing a substantial part of the semiconductor device during a manufacturing process succeeding FIG. 26.
Figure 29:
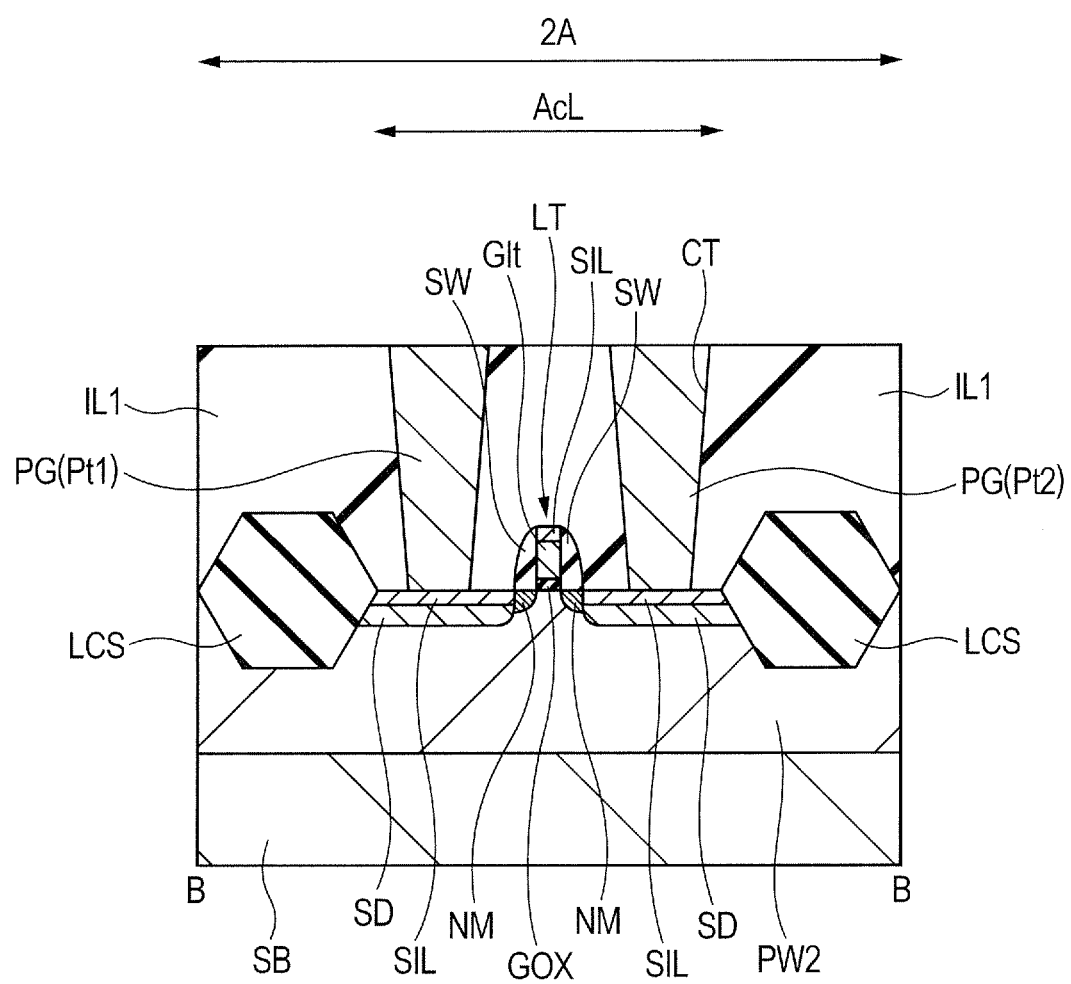
FIG. 29 is a sectional view showing a substantial part of the semiconductor device during the same manufacturing process as shown in FIG. 28.

A manufacturing method of a semiconductor device according to the present embodiment is hereunder explained in reference to FIGS. 6 to 29. The manufacturing process succeeding FIGS. 28 and 29 is explained by using FIGS. 6 and 7 in order to simplify the figures.

FIGS. 8 to 29 and FIGS. 6 and 7 are sectional views of substantial parts of a semiconductor device according to the present embodiment during manufacturing processes. In FIGS. 8 to 29, FIGS. 8, 10, 12, 14, 16, 18, 20, 22, 24, 26, and 28 are sectional views corresponding to FIG. 6, namely sectional views taken at a position corresponding to the line A-A of FIG. 3. In FIGS. 8 to 29, FIGS. 9, 11, 13, 15, 17, 19, 21, 23, 25, 27, and 29 are sectional views corresponding to FIG. 7, namely sectional views taken at a position corresponding to the line B-B of FIG. 5.

Figure 8:
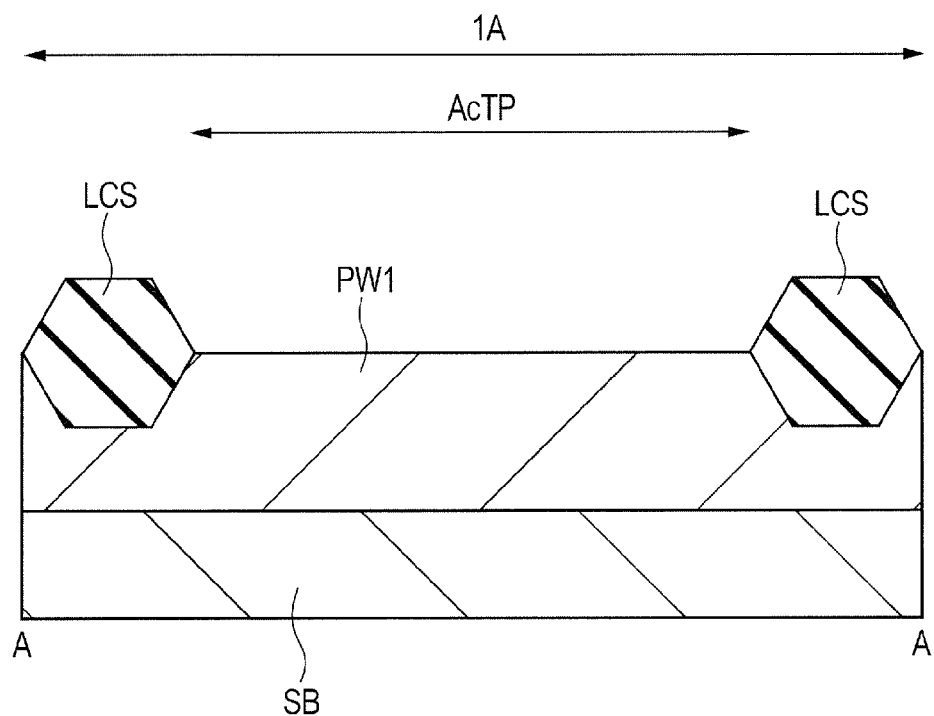
FIG. 8 is a sectional view showing a substantial part of a semiconductor device according to an embodiment during a manufacturing process.
Figure 9:
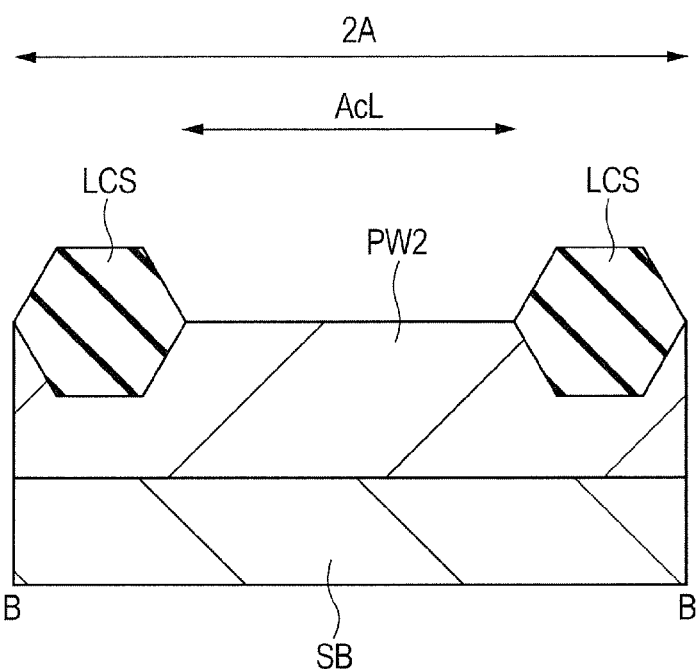
FIG. 9 is a sectional view showing a substantial part of the semiconductor device during the same manufacturing process as shown in FIG. 8.

In order to manufacture a semiconductor device according to the present embodiment, firstly a semiconductor substrate (semiconductor wafer) SB is arranged (prepared) as shown in FIGS. 8 and 9.

The semiconductor substrate SB is a semiconductor substrate (semiconductor wafer) including an n-type monocrystal silicon or the like into which n-type impurities such as phosphorus (P) or arsenic (As) are introduced for example. As another case, the semiconductor substrate SB may also be a so-called epitaxial wafer. In the case of using an epitaxial wafer as the semiconductor substrate SB, the semiconductor substrate SB can be formed by growing an epitaxial layer including an $n^-$-type monocrystal silicon into which n-type impurities (for example, phosphorus (P)) are introduced over the principal surface of an $n^+$-type monocrystal silicon substrate into which n-type impurities (for example, arsenic (As)) are introduced, for example.

Successively, a process for forming an element isolation region LCS in the semiconductor substrate SB is applied.

The element isolation region LCS includes an insulating film such as an oxide film. For example, the element isolation region LCS including a thermally-oxidized film can be formed over the principal surface of the semiconductor substrate SB in the region not covered with a silicon nitride film by thermally oxidizing the semiconductor substrate SB in the state of covering the regions in the semiconductor substrate SB that are to be active regions such as an active region AcTP and an active region AcL with the silicon nitride film. A method for forming such an element isolation region is called a LOCOS (Local Oxidation of Silicon) method. The active regions such as the active region AcTP and the active region AcL are partitioned (specified) by the element isolation region LCS.

It is also possible to form an element isolation region LCS by an STI (Shallow Trench Isolation) method instead of the LOCOS method. In the case of using the STI method, the element isolation region LCS includes an insulating film (silicon oxide film for example) embedded into a groove in the semiconductor substrate SB. For example, the regions in the semiconductor substrate SB that are to be active regions such as an active region AcTP and an active region AcL are covered with a silicon nitride film. Then a groove for element isolation is formed in the semiconductor substrate SB by etching the semiconductor substrate SB with the silicon nitride film used as an etching mask and successively the element isolation region LCS can be formed by embedding an insulating film such as a silicon oxide film into the groove for element isolation.

Here, the active region AcTP is formed in the pixel region 1A and the active region AcL is formed in the peripheral circuit region 2A.

Successively, as shown in FIGS. 8 and 9, the process for forming a p-type well (p-type semiconductor region) PW1 over the semiconductor substrate SB in the pixel region 1A and the process for forming a p-type well (p-type semiconductor region) PW2 over the semiconductor substrate SB in the peripheral circuit region 2A are applied.

The p-type well PW1 is a p-type semiconductor region for forming a photodiode PD and also is a p-type well region for forming an re-channel type transfer transistor TX. The p-type well PW2 is a p-type well region for forming an n-channel type peripheral transistor LT.

The p-type wells PW1 and PW2 are formed from the principal surface of the semiconductor substrate SB to a prescribed depth, respectively. The p-type wells PW1 and PW2 can be formed by implanting ions of p-type impurities such as boron (B) into the semiconductor substrate SB for example.

The p-type well PW1 is formed across the region where the photodiode PD is formed and the region where the transfer transistor TX is formed in the pixel region 1A. That is, the p-type well PW1 is formed over the whole active region AcPT in the pixel region 1A. The p-type well PW2 is formed in the peripheral circuit region 2A. The ion implantation for forming the p-type well PW1 and the ion implantation for forming the p-type well PW2 are applied either through different ion implantation processes or through an identical ion implantation process.

The electrically conductive type of the p-type wells PW1 and PW2 is a p-type and is an electrically conductive type opposite to the n-type that is the electrically conductive type of the semiconductor substrate SB. The p-type wells PW1 and PW2 are deeper than the element isolation region LCS from the principal surface of the semiconductor substrate SB.

Meanwhile, although the explanations are made on the basis of the case where the peripheral transistor LT formed in the peripheral circuit region 2A is an n-channel type MISFET in the present embodiment, the peripheral transistor LT may be a p-channel type MISFET by reversing the electrically conductive type. Otherwise, it is also possible to form both an n-channel type MISFET and a p-channel type MISFET in the peripheral circuit region 2A.

Figure 10:
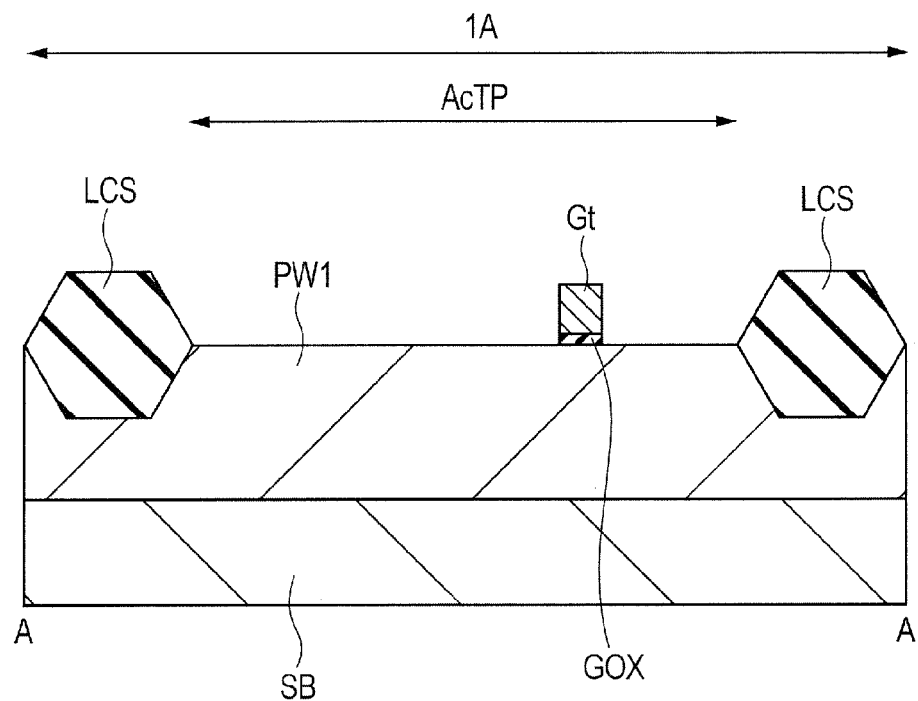
FIG. 10 is a sectional view showing a substantial part of the semiconductor device during a manufacturing process succeeding FIG. 8.
Figure 11:
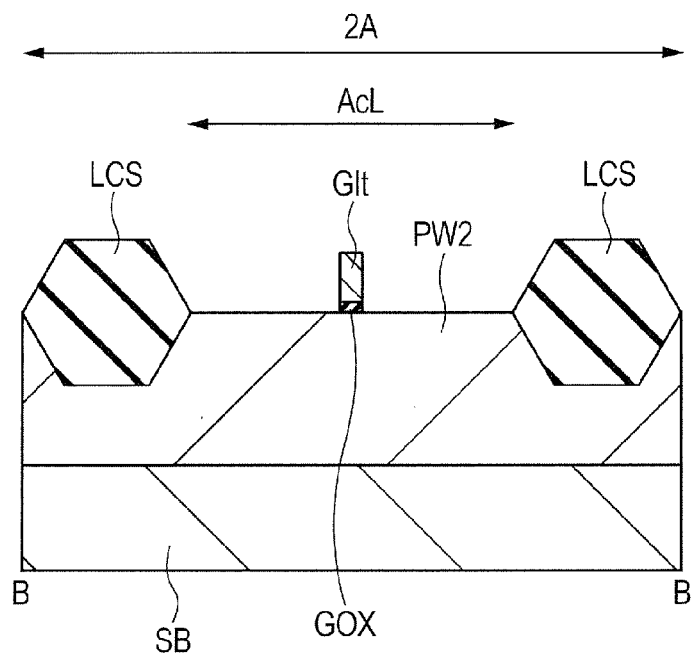
FIG. 11 is a sectional view showing a substantial part of the semiconductor device during the same manufacturing process as shown in FIG. 10.

Successively, as shown in FIGS. 10 and 11, a gate electrode Gt for the transfer transistor TX is formed over the semiconductor substrate SB (p-type well PW1) with a gate insulating film GOX interposed in the pixel region 1A and a gate electrode Glt for the peripheral transistor LT is formed over the semiconductor substrate SB (p-type well PW2) with the gate insulating film GOX interposed in the peripheral circuit region 2A.

That is, firstly the principal surface of the semiconductor substrate SB is cleaned by washing treatment or the like and thereafter an insulating film for the gate insulating film GOX is formed over the principal surface of the semiconductor substrate SB. The insulating film for the gate insulating film GOX includes a silicon oxide film and can be formed by a thermal oxidization method or the like for example. As another case, it is also possible to use a high permittivity insulating film such as a silicon oxynitride film or a metal oxide film (hafnium oxide film for example) as the insulating film for the gate insulating film GOX. Successively, after an electrically conductive film (polycrystal silicon film for example) for the gate electrode is formed over the semiconductor substrate SB, namely over the insulating film for the gate insulating film GOX, by a CVD (Chemical Vapor Deposition) method or the like, the electrically conductive film for the gate electrode is patterned by a photolithography method and a dry etching method. As a result, it is possible to form the gate electrodes Gt and Glt including the patterned electrically conductive film (polycrystal silicon films for example). The insulating film for the gate insulating film GOX remaining under the gate electrodes Gt and Glt comes to be the gate insulating film GOX. Further, the insulating film for the gate insulating film GOX in the region not covered with the gate electrodes Gt and Glt can be removed by dry etching for patterning the electrically conductive film for the gate electrode or wet etching after the dry etching. It is also possible to form the gate electrode Gr, the gate electrode Gs, and the gate electrode Ga of other transistors shown in FIG. 3 for example such as a reset transistor RST, a selection transistor SEL, and an amplification transistor AMI together when the electrically conductive film for the gate electrode is patterned and the gate electrodes Gt and Glt are formed.

The gate electrode Gt functions as the gate electrode of the transfer transistor TX and is formed over the semiconductor substrate SB (p-type well PW1) with the gate insulating film GOX interposed in the pixel region 1A. The gate insulating film GOX under the gate electrode Gt functions as the gate insulating film of the transfer transistor TX. The gate electrode Glt functions as the gate electrode of the peripheral transistor LT and is formed over the semiconductor substrate SB (p-type well PW2) with the gate insulating film GOX interposed in the peripheral circuit region 2A. The gate insulating film GOX under the gate electrode Glt functions as the gate insulating film of the peripheral transistor LT.

Figure 12:
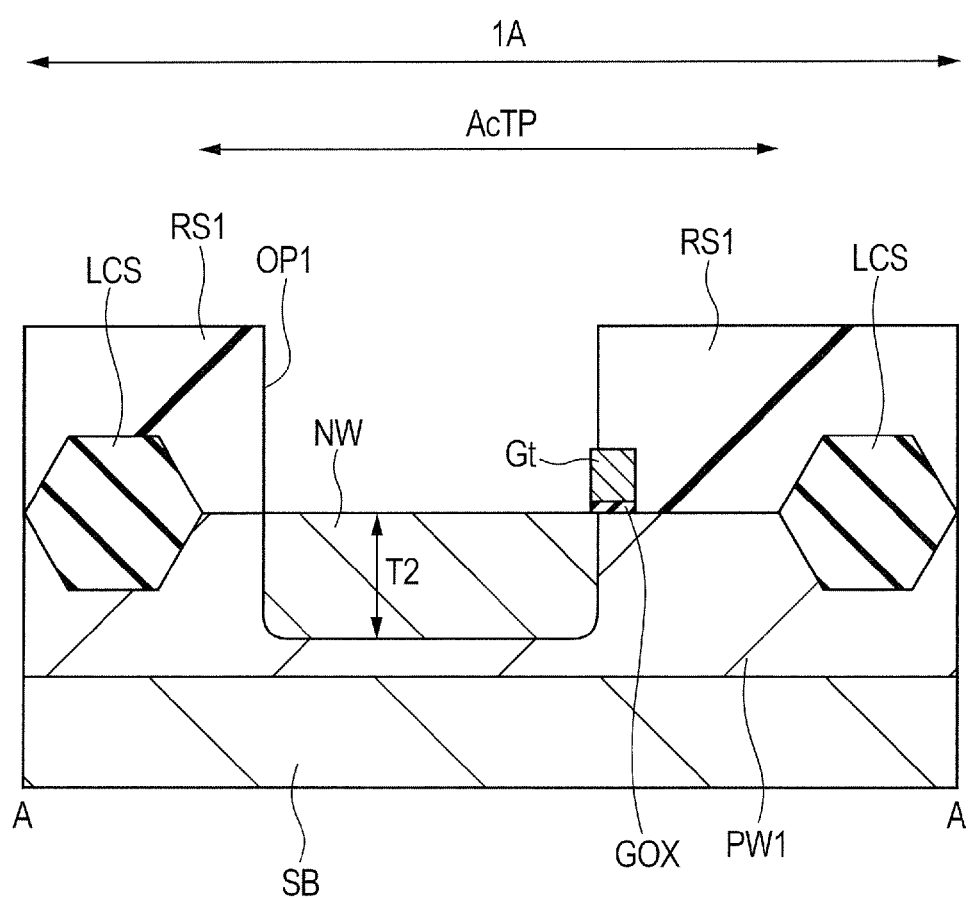
FIG. 12 is a sectional view showing a substantial part of the semiconductor device during a manufacturing process succeeding FIG. 10.
Figure 13:
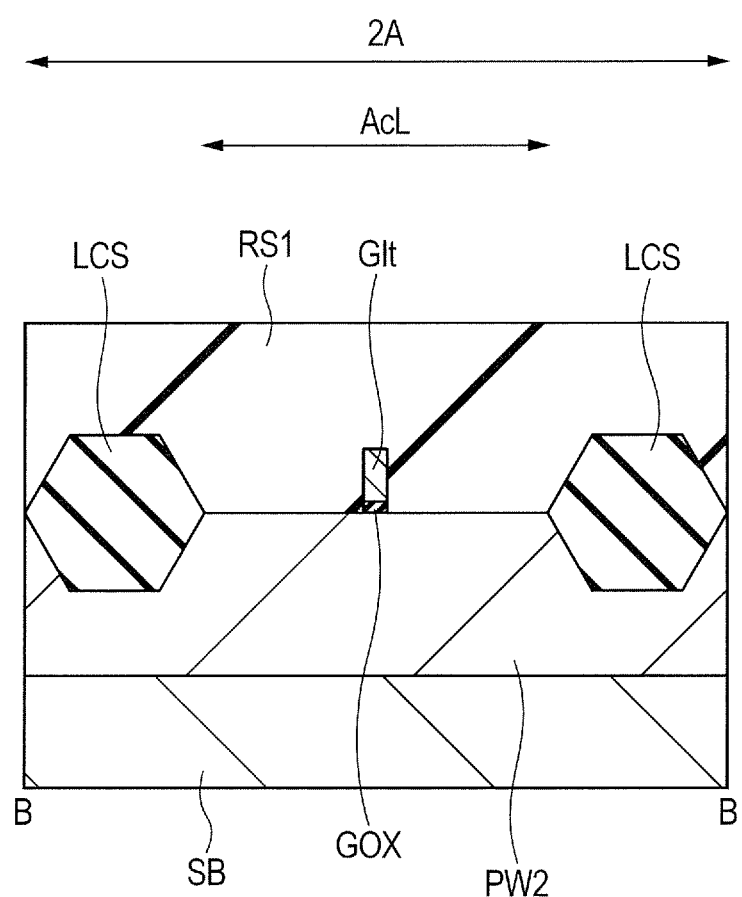
FIG. 13 is a sectional view showing a substantial part of the semiconductor device during the same manufacturing process as shown in FIG. 12.

Successively, as shown in FIGS. 12 and 13, a process for forming an n-type semiconductor region NW is applied to the semiconductor substrate SB in the active region AcTP in the pixel region 1A. The n-type semiconductor region NW can be formed by implanting ions of n-type impurities such as phosphorus (P) or arsenic (As) into the semiconductor substrate SB in the active region AcTP in the pixel region 1A.

The n-type semiconductor region NW is an n-type semiconductor region for forming the photodiode PD and is formed so that the depth (of the bottom face) of the n-type semiconductor region NW may be shallower than the depth (of the bottom face) of the p-type well PW1 and the n-type semiconductor region NW may be embraced by the p-type well PW1. Since the n-type semiconductor region NW is formed so as to be embraced by the p-type well PW1, the bottom face and the side face of the n-type semiconductor region NW touch the p-type well PW1.

The n-type semiconductor region NW is not formed in the whole active region AcTP in the pixel region 1A, but is formed in the region of the semiconductor substrate SB on one side (source side) in both the sides of the gate electrode Gt in the active region AcTP, and is not formed in the region on the other side (drain side).

The n-type semiconductor region NW can be formed concretely as follows for example. That is, as shown in FIGS. 12 and 13, firstly a photoresist pattern (photoresist layer) RS1 is formed as a resist layer over the semiconductor substrate SB by a photolithography technology. The photoresist pattern RS1 has an opening OP1 to open (expose) the active region AcTP in the pixel region 1A on one side (source side) in both the sides of the gate electrode Gt and the active region AcTP in the pixel region 1A on the other side (drain side) in both the sides of the gate electrode Gt is covered with the photoresist pattern RS1. Then n-type impurity ions are implanted into the semiconductor substrate SB with the photoresist pattern RS1 used as a mask (ion implantation prevention mask). As a result, in the pixel region 1A, the ions of the n-type impurities are implanted into the semiconductor substrate SB of the location overlapping with the opening OP1 in a planar view and thereby the n-type semiconductor region NW is formed in the semiconductor substrate SB in the active region AcTP in the pixel region 1A so as to be embraced by the p-type well PW1. Successively, the photoresist pattern RS1 is removed.

Meanwhile, at the ion implantation process for forming the n-type semiconductor region NW, as shown in FIG. 13, the photoresist pattern RS1 is formed over the whole peripheral circuit region 2A. That is, the photoresist pattern RS1 is formed over the semiconductor substrate SB so as to cover the gate electrode Glt over the whole peripheral circuit region 2A. As a result, at the ion implantation process for forming the n-type semiconductor region NW, the photoresist pattern RS1 functions as the mask (ion implantation prevention mask) and hence the ion implantation is not applied over the semiconductor substitute SB (p-type well PW2) in the peripheral circuit region 2A. That is, in the event of ion implantation for forming the n-type semiconductor region NW, the semiconductor substrate SB in the region other than an n-type semiconductor region NW forming region is covered with the photoresist pattern RS1 and the ions of the n-type impurities are implanted selectively into the n-type semiconductor region NW forming region.

Figure 14:
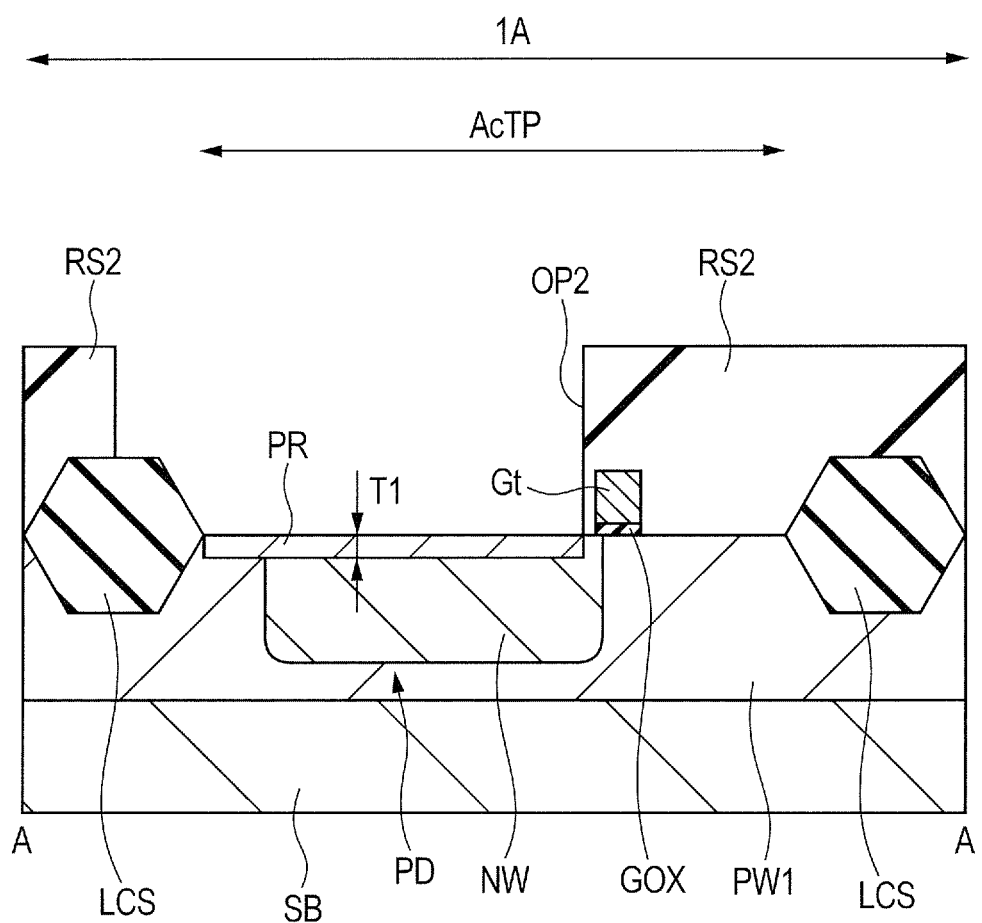
FIG. 14 is a sectional view showing a substantial part of the semiconductor device during a manufacturing process succeeding FIG. 12.
Figure 15:
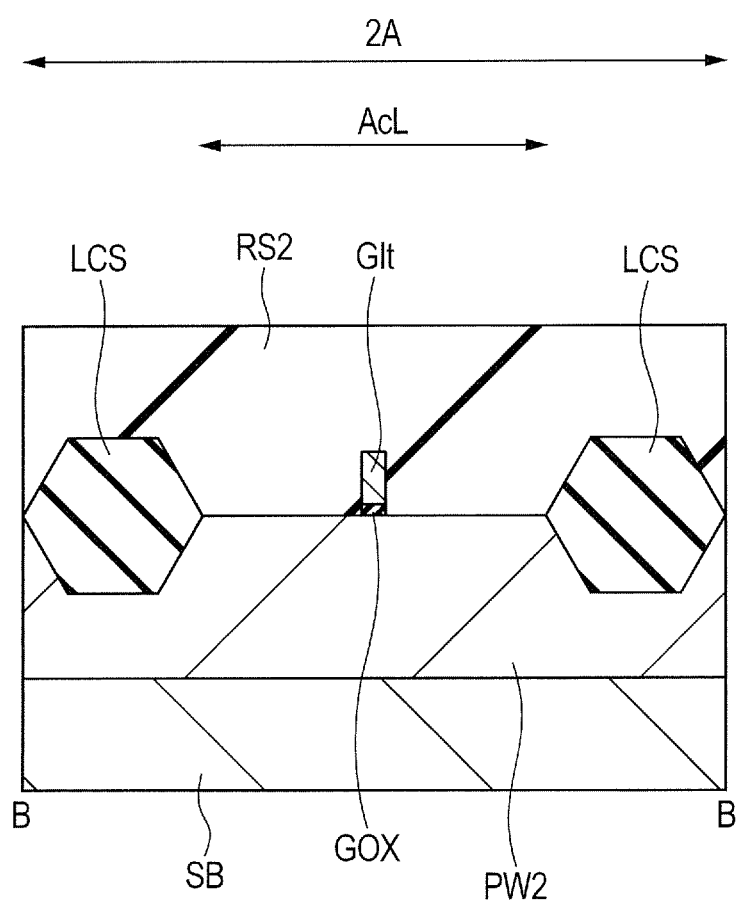
FIG. 15 is a sectional view showing a substantial part of the semiconductor device during the same manufacturing process as shown in FIG. 14.

Successively, as shown in FIGS. 14 and 15, a process for forming a $p^+$-type semiconductor region PR is applied to the semiconductor substrate SB in the active region AcTP in the pixel region 1A.

The $p^+$-type semiconductor region PR is formed by implanting the ions of impurities such as boron (B) into the semiconductor substrate SB for example.

The $p^+$-type semiconductor region PR is a $p^+$-type semiconductor region into which p-type impurities are introduced (doped) at a high concentration and the impurity concentration (p-type impurity concentration) of the $p^+$-type semiconductor region PR is higher than the impurity concentration (p-type impurity concentration) of the p-type well PW1.

The depth (of the bottom face) of the $p^+$-type semiconductor region PR is shallower than the depth (of the bottom face) of the n-type semiconductor region NW. The $p^+$-type semiconductor region PR is mainly formed at the surface layer part (surface region) of the n-type semiconductor region NW. As a result, when viewed in the thickness direction of the semiconductor substrate SB, the n-type semiconductor region NW is in the state of existing under the $p^+$-type semiconductor region PR as the uppermost layer and the p-type well PW1 is in the state of existing under the n-type semiconductor region NW.

The $p^+$-type semiconductor region PR can be formed concretely as follows for example. That is, as shown in FIGS. 14 and 15, firstly a photoresist pattern (photoresist layer) RS2 is formed as a resist layer over the semiconductor substrate SB by a photolithography technology. The photoresist pattern RS2 has an opening OP2 to open (expose) a $p^+$-type semiconductor region PR forming region in the active region AcTP in the pixel region 1A. As shown in FIG. 14, the photoresist pattern RS2 covers the gate electrode Gt completely, the sidewall on one side of the photoresist pattern RS2 constituting the opening OP2 is located above the n-type semiconductor region NW, and the sidewall on the other side is located above the element isolation region LCS. Then the ions of impurities such as boron (B) are implanted into the semiconductor substrate SB with the photoresist pattern RS2 used as a mask (ion implantation prevention mask). As a result, in the pixel region 1A, the $p^+$-type semiconductor region PR is formed at the surface layer part of the p-type well PW1 and at the surface layer part of the n-type semiconductor region NW. Successively, the photoresist pattern RS2 is removed.

Meanwhile, at the ion implantation process for forming the $p^+$-type semiconductor region PR, as shown in FIG. 15, the photoresist pattern RS2 is formed over the whole peripheral circuit region 2A. That is, the photoresist pattern RS2 is formed over the semiconductor substrate SB so as to cover the gate electrode Glt in the whole peripheral circuit region 2A. As a result, at the ion implantation process for forming the $p^+$-type semiconductor region PR, the photoresist pattern RS2 functions as the mask (ion implantation prevention mask) and hence the ion implantation is not applied over the semiconductor substrate SB (p-type well PW2) in the peripheral circuit region 2A.

Meanwhile, in the region where the n-type semiconductor region NW is not formed, a part of the $p^+$-type semiconductor region PR touches the p-type well PW1. That is, the $p^+$-type semiconductor region PR has a part that has the n-type semiconductor region NW existing right thereunder and touches the n-type semiconductor region NW and a part that has the p-type well PW1 existing right thereunder and touches the p-type well PW1.

The p-type well PW1 is a p-type semiconductor region for forming the photodiode PD, the n-type semiconductor region NW is an n-type semiconductor region for forming the photodiode PD, and the $p^+$-type semiconductor region PR is a p-type semiconductor region for forming the photodiode PD. The photodiode (PN-junction diode) PD includes the p-type well PW1 (p-type semiconductor region), the n-type semiconductor region NW, and the $p^+$-type semiconductor region PR. A PN junction is formed between the p-type well PW1 and the n-type semiconductor region NW and another PN junction is formed between the $p^+$-type semiconductor region PR and the n-type semiconductor region NW.

Meanwhile, it is desirable to apply annealing treatment, namely thermal treatment, for remedying a crystal defect (mainly crystal defect caused by ion implantation) after the $p^+$-type semiconductor region PR is formed by ion implantation. By the annealing treatment, crystal defects in the n-type semiconductor region NW and the $p^+$-type semiconductor region PR can be remedied.

The annealing treatment (thermal treatment) can be applied by laser annealing, microwave annealing, RTA (Rapid Thermal Annealing), furnace annealing, or a combination of them for example. The temperature of the annealing treatment (thermal treatment) applied after ion implantation can be about 300° C. to 1,200° C. for example. Here, the laser annealing is annealing (thermal treatment) by the irradiation of a laser, the microwave annealing is annealing (thermal treatment) by the irradiation of a microwave, the RTA is short-time annealing using lamp heating or the like, and the furnace annealing is annealing (thermal treatment) by heating in an annealing furnace.

Figure 16:
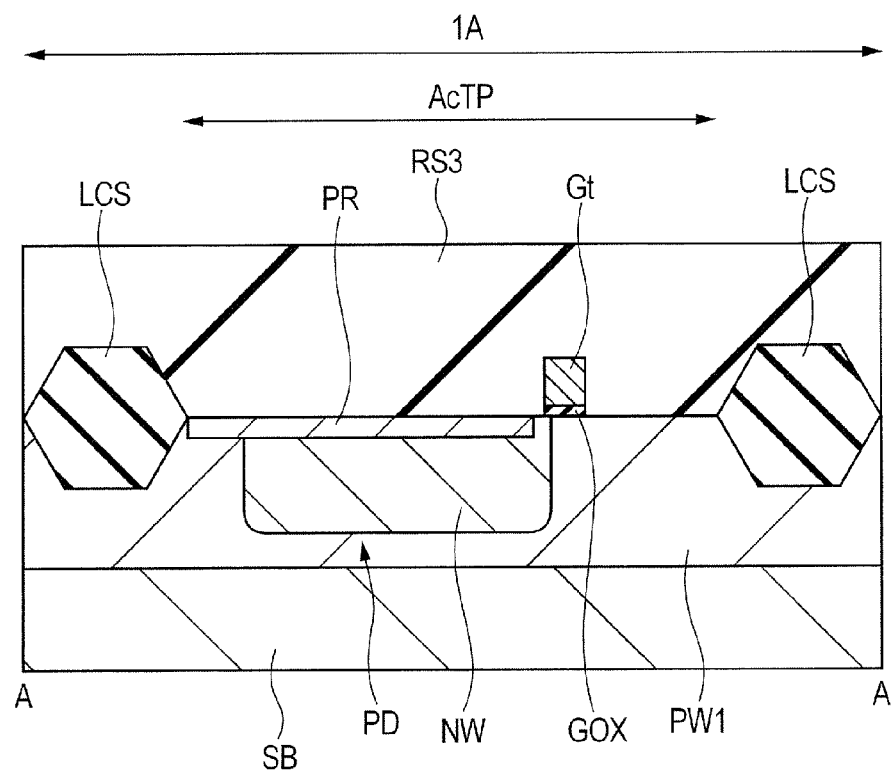
FIG. 16 is a sectional view showing a substantial part of the semiconductor device during a manufacturing process succeeding FIG. 14.
Figure 17:
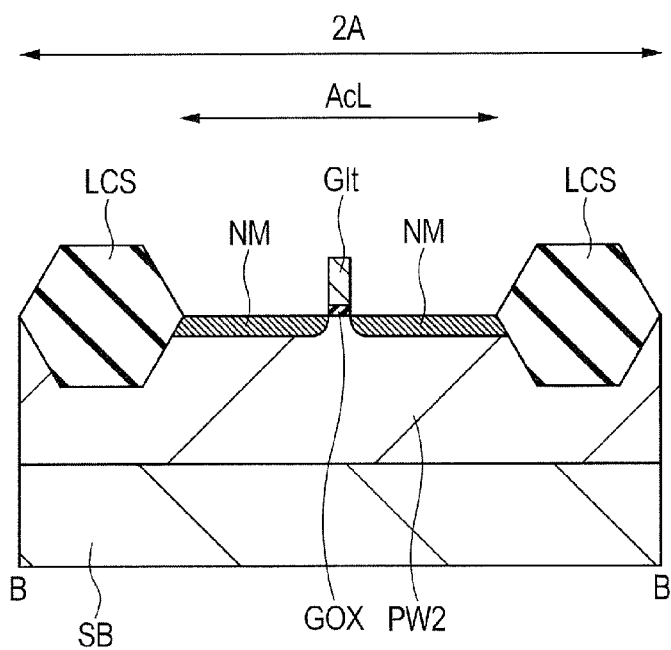
FIG. 17 is a sectional view showing a substantial part of the semiconductor device during the same manufacturing process as shown in FIG. 16.

Successively, as shown in FIGS. 16 and 17, in the peripheral circuit region 2A, a process for forming an $n^-$-type semiconductor region (source/drain extension region) NM in the semiconductor substrate SB (p-type well PW2) on both the sides of the gate electrode Glt is applied.

The $n^-$-type semiconductor region NM can be formed concretely as follows for example. That is, as shown in FIGS. 16 and 17, firstly a photoresist pattern (photoresist layer) RS3 to open (expose) the peripheral circuit region 2A is formed over the semiconductor substrate SB by a photolithography technology. Then ions of n-type impurities such as phosphorus (P) or arsenic (As) are implanted into the semiconductor substrate SB (p-type well PW2) in the peripheral circuit region 2A with the photoresist pattern RS3 used as a mask (ion implantation prevention mask). On this occasion, since the gate electrode Glt functions as a mask (ion implantation prevention mask) in the peripheral circuit region 2A, the impurities are prevented from being implanted in the region of the semiconductor substrate SB right under the gate electrode Glt. As a result, the ions of the n-type impurities are implanted into the region of the semiconductor substrate SB (p-type well PW2) on both the sides of the gate electrode Glt in the peripheral circuit region 2A and thereby the n⁻-type semiconductor region NM is formed. Successively, the photoresist pattern RS3 is removed.

Meanwhile, at the ion implantation process for forming the n⁻-type semiconductor region NM, as shown in FIG. 16, in the pixel region 1A, the photoresist pattern RS3 is formed over the semiconductor substrate SB including the surface of the gate electrode Gt. That is, the active region AcTP in the pixel region 1A is covered with the photoresist pattern RS3. As a result, at the ion implantation process for forming the n⁻-type semiconductor region NM, the photoresist pattern RS3 functions as the mask (ion implantation prevention mask) and hence ions are not implanted over the semiconductor substrate SB in the active region AcTP. As a result, at the ion implantation process for forming the n⁻-type semiconductor region NM, ions are not implanted into the p-type well PW1, the n-type semiconductor region NW, and the p⁺-type semiconductor region PR in the active region AcTP.

Figure 18:
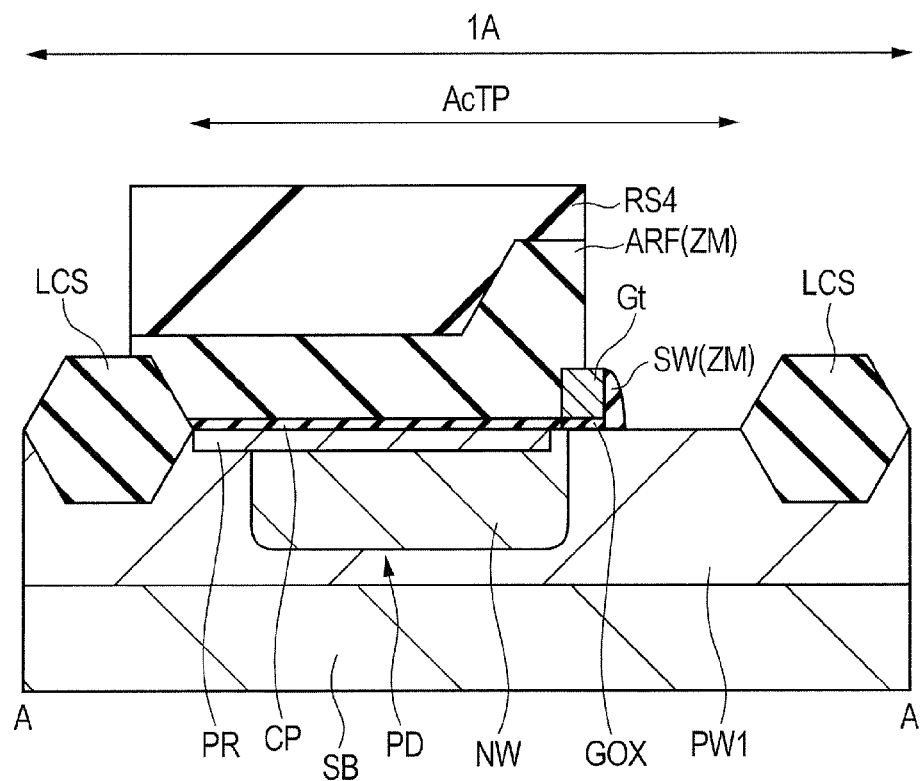
FIG. 18 is a sectional view showing a substantial part of the semiconductor device during a manufacturing process succeeding FIG. 16.
Figure 19:
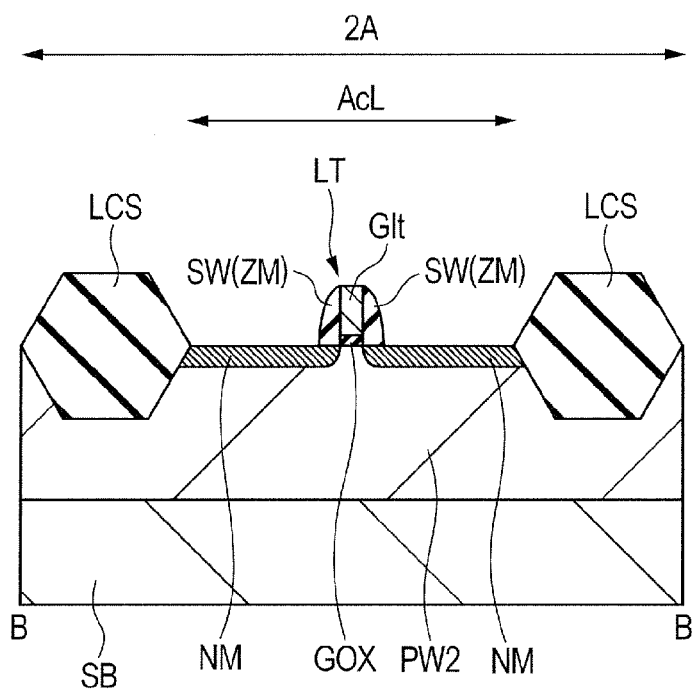
FIG. 19 is a sectional view showing a substantial part of the semiconductor device during the same manufacturing process as shown in FIG. 18.

Successively, as shown in FIGS. 18 and 19, a process for forming a cap insulating film CP, an antireflection film ARF, and a sidewall spacer SW is applied over the semiconductor substrate SB in the pixel region 1A.

Firstly, the cap insulating film CP can be formed by forming an insulating film over the principal surface of the semiconductor substrate SB and then patterning the insulating film by a photolithography method and a dry etching method for example. The cap insulating film CP can include a silicon oxide film or a silicon nitride film for example. The cap insulating film CP is formed over the surfaces (exposed surfaces) of the n-type semiconductor region NW and the p⁺-type semiconductor region PR. The cap insulating film CP is formed for the purpose of keeping the surface characteristics, namely the interface characteristics, of the semiconductor substrate SB well.

Successively, the antireflection film ARF and the sidewall spacer SW are formed. The antireflection film ARF is formed over the cap insulating film CP and the sidewall spacer SW is formed over the sidewalls of the gate electrodes Gt and Glt.

The antireflection film ARF and the sidewall spacer SW can be formed as follows for example. That is, firstly an insulating film ZM is formed over the principal surface of the semiconductor substrate SB so as to cover the gate electrodes Gt and Glt. The insulating film ZM is commonly used as an insulating film for forming the antireflection film ARF and an insulating film for forming the sidewall spacer SW. Then a photoresist pattern RS4 is formed over the insulating film ZM in the region where the antireflection film ARF is formed by a photolithography technology. The source side of the transfer transistor TX is covered completely with the photoresist pattern RS4. That is, the n-type semiconductor region NW and the p⁺-type semiconductor region PR formed on the source side of the transfer transistor TX are covered completely. As shown in FIG. 18, an end of the photoresist pattern RS4 is located above the gate electrode Gt and the other end is located above the element isolation region LCS. Further, a part of the gate electrode Gt and the drain region of the transfer transistor TX and the peripheral circuit region 2A are not covered with the photoresist pattern RS4. Here, the insulating film ZM constituting the antireflection film ARF includes a silicon nitride film or a silicon oxynitride film for example and the photoresist pattern RS4 includes an organic film including novolac resin for example.

The insulating film ZM is etched back with the photoresist pattern RS4 used as a mask (etching mask) by an anisotropic etching method such as an RIE (Reactive Ion Etching) method. As a result, the sidewall spacer SW is formed by leaving the insulating film ZM locally over the sidewalls of the gate electrodes Gt and Glt and the antireflection film ARF is formed by leaving the insulating film ZM under the photoresist pattern RS4. The antireflection film ARF is formed over the n-type semiconductor region NW and the p⁺-type semiconductor region PR with the cap insulating film CP interposed and a part (end) of the antireflection film ARF overrides the gate electrode Gt.

Although the sidewall spacer SW is formed over both the sidewalls of the gate electrode Glt, in the case of the gate electrode Gt, the sidewall spacer SW is formed only over the sidewall on the drain side (floating diffusion FD side) in both the sidewalls of the gate electrode Gt. The sidewall of the gate electrode Gt on the source side is covered with the antireflection film ARF.

Anisotropic etching is applied by using $CHF_3$, $CH_4$, and an Ar gas under the condition of an RF bias of 1 kW and, in the anisotropic etching, the surfaces of the semiconductor substrate SB in the floating diffusion FD forming region of the transfer transistor TX and the source/drain forming region of the peripheral transistor LT are exposed. FIGS. 18 and 19 show this stage and the photoresist pattern RS4 is removed thereafter.

Figure 20:
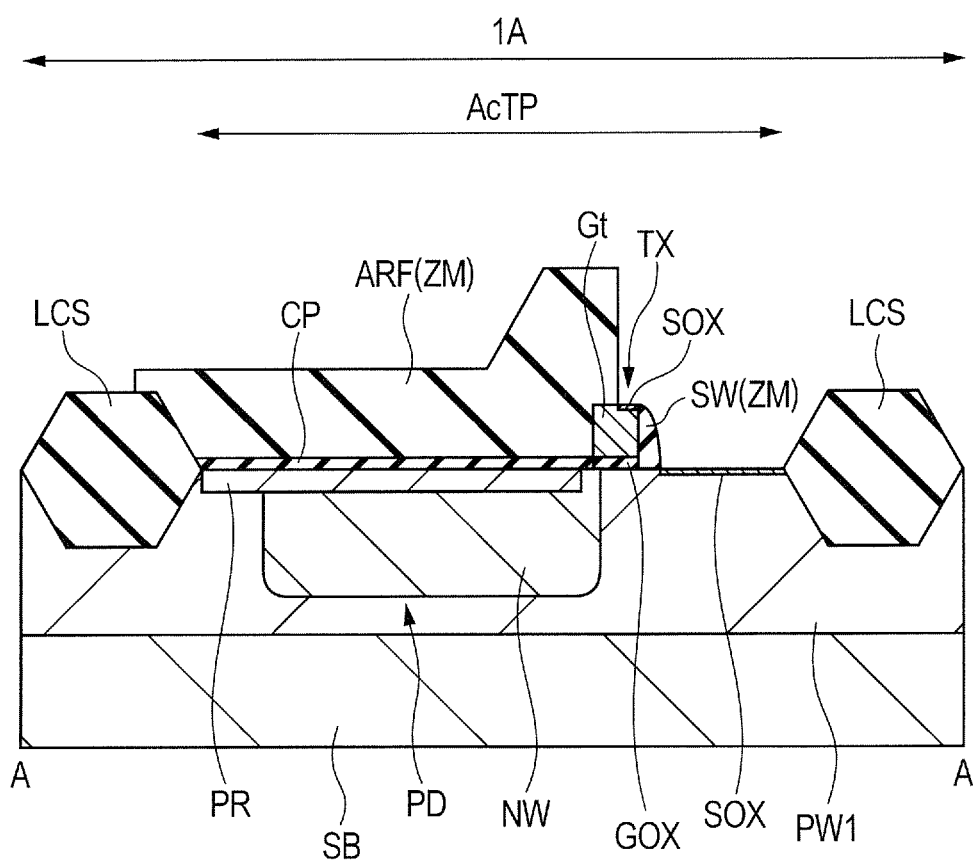
FIG. 20 is a sectional view showing a substantial part of the semiconductor device during a manufacturing process succeeding FIG. 18.
Figure 21:
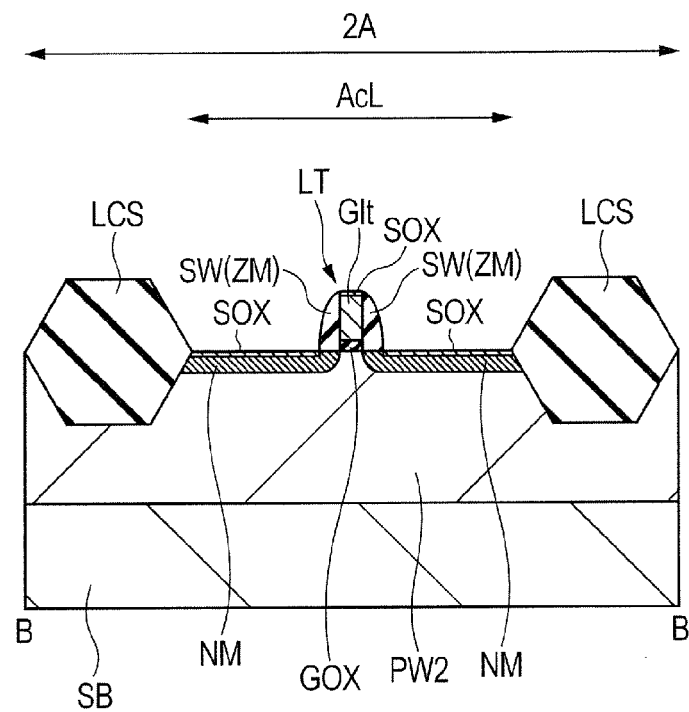
FIG. 21 is a sectional view showing a substantial part of the semiconductor device during the same manufacturing process as shown in FIG. 20.

Successively, as shown in FIGS. 20 and 21, a process for forming a sacrificial oxide film SOX over the surface of the semiconductor substrate SB is applied. The sacrificial oxide film SOX is formed over the surfaces of the floating diffusion FD forming region and the gate electrode Gt of the transfer transistor TX and the source/drain forming region and the gate electrode Glt of the peripheral transistor LT by applying thermal oxidation to the semiconductor substrate SB. The sacrificial oxide film SOX may merely be called an oxide film. The thermal oxidation is applied in the temperature range of 300° C. to 400° C. in an atmosphere containing oxygen and the sacrificial oxide film SOX having a thickness of 2 to 5 nm is formed. Otherwise, the thermal oxidation may be applied by using a low-temperature radical oxidization method at a temperature of about 300° C. in an atmosphere containing oxygen and hydrogen or by using a microwave heating method at a temperature of about 300° C. in an atmosphere containing ozone.

Figure 22:
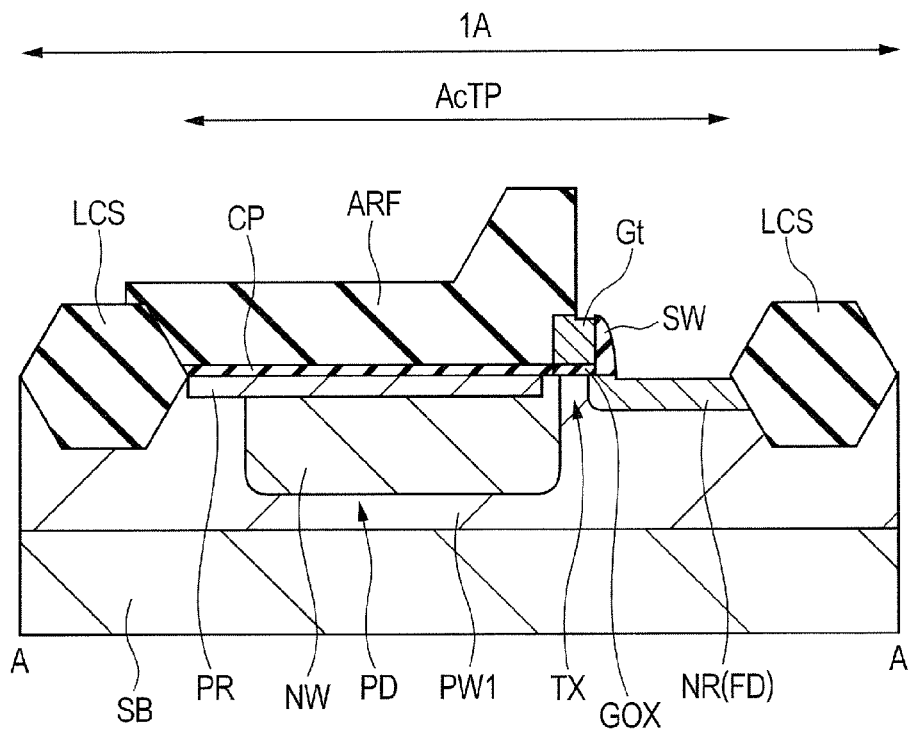
FIG. 22 is a sectional view showing a substantial part of the semiconductor device during a manufacturing process succeeding FIG. 20.
Figure 23:
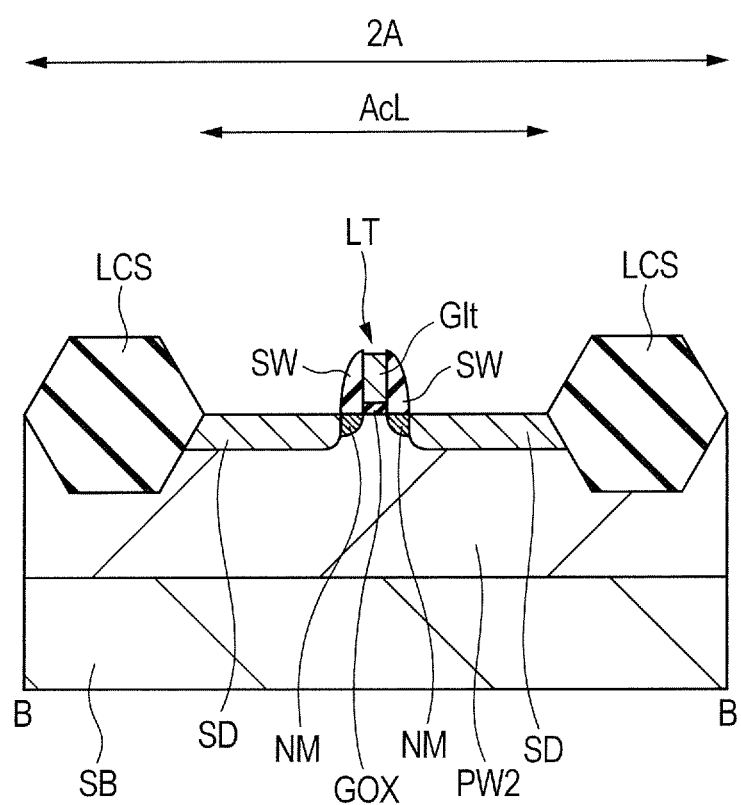
FIG. 23 is a sectional view showing a substantial part of the semiconductor device during the same manufacturing process as shown in FIG. 22.

Successively, as shown in FIGS. 22 and 23, a process for removing the sacrificial oxide film SOX and a succeeding process for forming an n-type semiconductor region NR and the n-type semiconductor region NW are applied.

Firstly, the sacrificial oxide film SOX is removed by a wet etching method using an HF (hydrogen fluoride) system solution for example. In the removal of the sacrificial oxide film SOX, it is desirable to use the wet etching method in consideration of substrate damage but it is also possible to use an isotropic dry etching method. By removing the sacrificial oxide film SOX, the surface of the semiconductor substrate SB in the floating diffusion FD forming region descends about 2 to 5 nm from the interface between the gate insulating film GXO of the transfer transistor TX and the semiconductor substrate SB and a depression appears for example. Further, similar depressions appear also over the surfaces of the gate electrode Gt of the transfer transistor TX and the source/drain forming region and the gate electrode Glt of the peripheral transistor LT.

Successively, in the active region AcTP in the pixel region 1A, an n-type semiconductor region NR is formed by implanting ions of impurities such as phosphorus (P) or arsenic (As) into the semiconductor substrate SB (p-type well PW1) on the other side (drain side) in both the sides of the gate electrode Gt. Here, the drain side corresponds to the side opposite to the side where the n-type semiconductor region NW is formed.

At the ion implantation process for forming the n-type semiconductor region NR, the antireflection film ARF and the gate electrode Gt can function as masks (ion implantation prevention masks) and hence impurities are prevented from being implanted in the region of the semiconductor substrate SB right under the antireflection film ARF and the gate electrode Gt. As a result, as shown in FIG. 22, it is possible to form the n-type semiconductor region NR in the semiconductor substrate SB (p-type well PW1) on the other side (drain side, namely the side opposite to the side where the n-type semiconductor region NW is formed) in both the sides of the gate electrode Gt of the transfer transistor TX.

The n-type semiconductor region NW and the n-type semiconductor region NR are formed so as to be separated from each other with a channel forming region (corresponding to the substrate region right under the gate electrode Gt) of the transfer transistor TX interposed. The n-type semiconductor region NR is an n-type high concentration semiconductor region functioning as the drain region of the transfer transistor TX. The n-type semiconductor region NR functions as the drain region of the transfer transistor TX but it can also be regarded as the floating diffusion (floating diffusion layer) FD.

Meanwhile, in the peripheral circuit region 2A, an $n^+$-type semiconductor region SD is formed in the semiconductor substrate SB (p-type well PW2) on both the sides of the synthetic body of the gate electrode Glt and the sidewall spacer SW by ion implantation. When ion implantation for forming the $n^+$-type semiconductor region SD is applied, the gate electrode Glt and the sidewall spacer SW over the sidewall thereof can function as masks (ion implantation prevention masks). As a result, the $n^+$-type semiconductor region SD is formed by implanting ions of n-type impurities (phosphorus or arsenic) in the region of the semiconductor substrate SB (p-type well PW2) in the peripheral circuit region 2A on both the sides of the synthetic body of the gate electrode Glt and the sidewall spacer SW.

The $n^+$-type semiconductor region SD is a semiconductor region of the same electrically conductive type (here, n-type) as the $n^-$-type semiconductor region NM but has an impurity concentration (n-type impurity concentration) higher and a depth (junction depth) deeper than the $n^-$-type semiconductor region NM. As a result, in the peripheral circuit region 2A, the semiconductor region (source/drain region) functioning as the source or the drain of the peripheral transistor LT includes the $n^+$-type semiconductor region SD and the $n^-$-type semiconductor region NM. Consequently, the source/drain region of the peripheral transistor LT has an LDD structure.

Here, the n-type semiconductor region NR and the $n^+$-type semiconductor region SD can be formed through the same ion implantation process but they can be formed through different ion implantation processes.

Meanwhile, it is also possible to form the source/drain regions of other transistors shown in FIG. 3, namely the reset transistor RST, the selection transistor SEL, and the amplification transistor AMI, through a process identical to the process for forming the n-type semiconductor region NR and the $n^+$-type semiconductor region SD for example. The source/drain regions of the reset transistor RST, the selection transistor SEL, and the amplification transistor AMI can be formed through an ion implantation process identical to the ion implantation process for forming either or both of the n-type semiconductor region NR and the $n^+$-type semiconductor region SD but can also be formed through an ion implantation process different from the n-type semiconductor region NR and the $n^+$-type semiconductor region SD.

Meanwhile, in the case of forming a p-channel type MISFET in the peripheral circuit region 2A, a $p^+$-type semiconductor region that is to be the source/drain region of the p-type MISFET may be formed in the peripheral circuit region 2A. For example, it is possible to form the $p^+$-type semiconductor region that is to be the source/drain region of the p-type MISFET by implanting ions of p-type impurities into an n-type well on both the sides of the gate electrode of the p-channel type MISFET not shown in the figure in the peripheral circuit region 2A. On this occasion, it is also possible to implant ions of p-type impurities into the active region AcG.

Successively, annealing treatment (thermal treatment) for activating impurities heretofore introduced by ion implantation is applied.

Through the above processes, the photodiode PD, the transfer transistor TX, and other transistors not shown in the sectional views of FIGS. 22 and 23, namely the reset transistor RST, the selection transistor SEL, and the amplification transistor AMI, are formed in each pixel region 1A in the semiconductor substrate SB (refer to FIG. 3 shown earlier). Further, the peripheral transistor LT as the MISFET is formed in the peripheral circuit region 2A in the semiconductor substrate SB.

Figure 24:
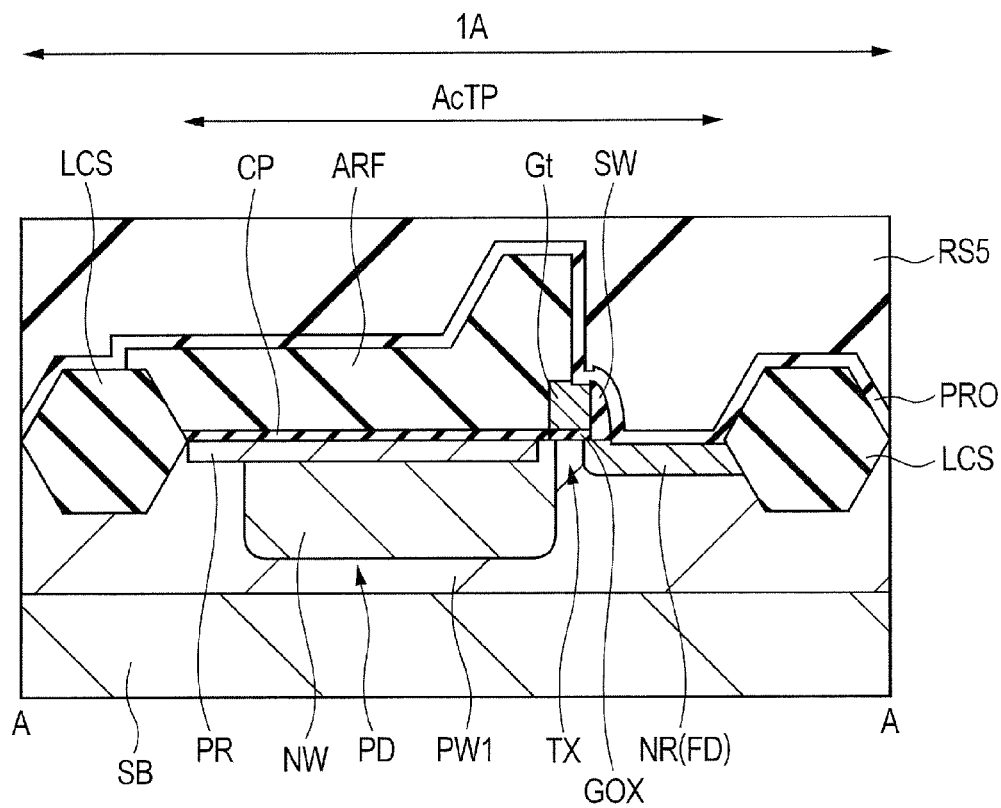
FIG. 24 is a sectional view showing a substantial part of the semiconductor device during a manufacturing process succeeding FIG. 22.
Figure 25:
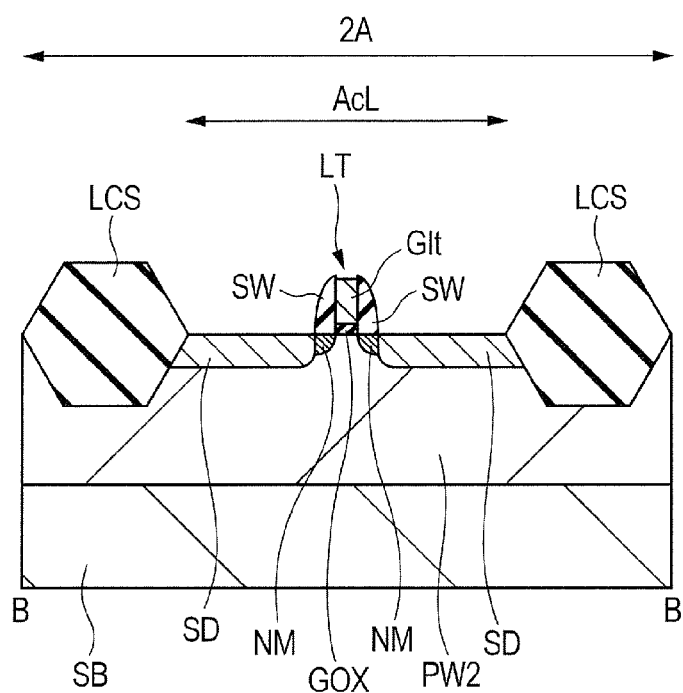
FIG. 25 is a sectional view showing a substantial part of the semiconductor device during the same manufacturing process as shown in FIG. 24.

Successively, as shown in FIGS. 24 and 25, a process for forming a silicide block film PRO is applied.

Firstly, a silicide block film PRO including a silicon oxide film is formed over the principal surface of the semiconductor substrate SB for example. Successively, a photoresist pattern RS5 having a pattern of covering the pixel region 1A and exposing the peripheral circuit region 2A is formed and anisotropic dry etching is applied to the silicide block film PRO with the photoresist pattern RS5 used as a mask. Then the silicide block film PRO is left selectively only in the pixel region 1A so as to cover at least the floating diffusion FD and, in the peripheral circuit region 2A, the surfaces of the $n^+$-type semiconductor region SD that is to be the source/drain region of the peripheral transistor LT and the gate electrode Glt are exposed. Here, the photoresist pattern RS5 includes a material similar to the photoresist pattern RS4 and the anisotropic dry etching condition of the silicide block film PRO is similar to the anisotropic etching condition of the insulating film ZM. Successively, the photoresist pattern RS5 is removed.

Figure 26:
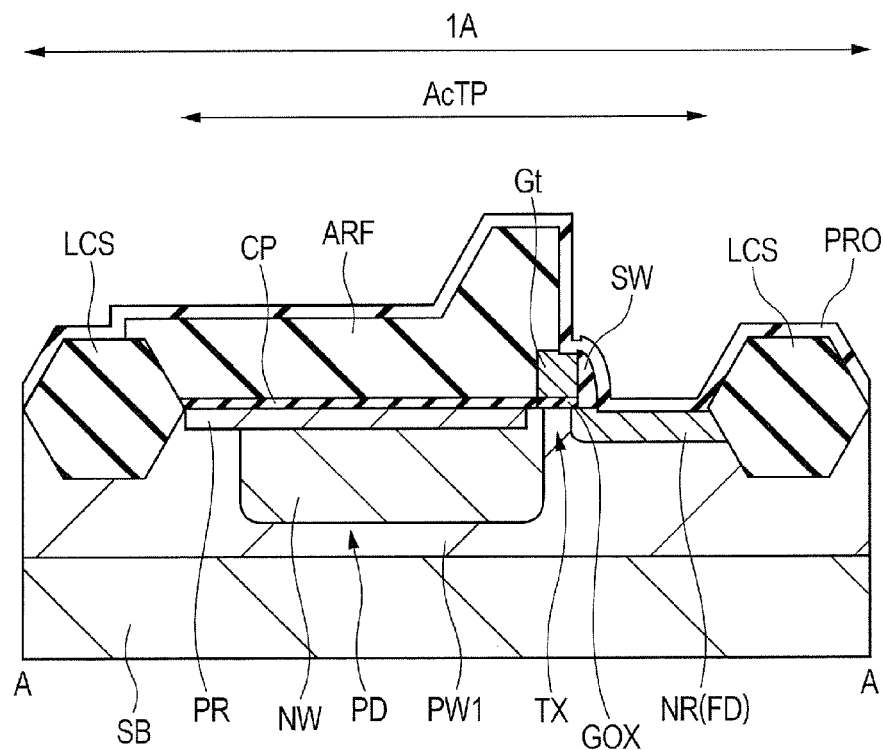
FIG. 26 is a sectional view showing a substantial part of the semiconductor device during a manufacturing process succeeding FIG. 24.
Figure 27:
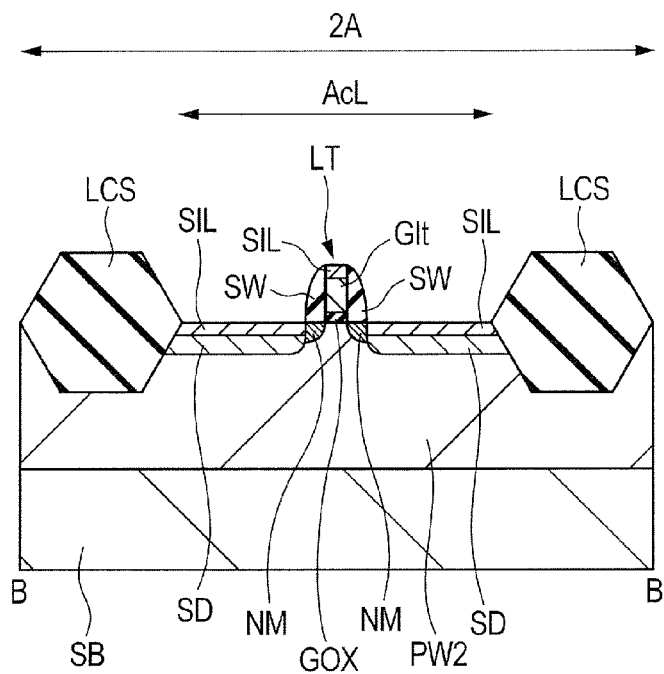
FIG. 27 is a sectional view showing a substantial part of the semiconductor device during the same manufacturing process as shown in FIG. 26.

Successively, as shown in FIGS. 26 and 27, a process for forming a low-resistance metallic silicide layer SIL at the upper part (surface layer part) of the $n^+$-type semiconductor region SD, the upper part (surface layer part) of the gate electrode Glt, and other parts by a Salicide (Self Aligned Silicide) technology is applied.

The metallic silicide layer SIL can be formed by forming a metallic film for forming a metallic silicide layer over the semiconductor substrate SB, then applying thermal treatment, thus reacting the metallic film with the surface layer parts of the $n^+$-type semiconductor region SD and the gate electrode Glt, and then removing the unreacted part of the metallic film for example. As a result, it is possible to form the metallic silicide layer SIL at the upper part (surface layer part) of the $n^+$-type semiconductor region SD, the upper part (surface layer part) of the gate electrode Glt, and other parts. As the metallic film for forming a metallic silicide layer, a metallic film such as a nickel (Ni) film, a titanium (Ti) film, a cobalt (Co) film, a platinum (Pt) film, or the like or an alloy film of those metals can be used.

Meanwhile, on this occasion for example, it is also possible to form the metallic silicide layer SIL at the upper parts (surface layer parts) of the gate electrode Gr, the gate electrode Gs, the gate electrode Ga, and the source/drain regions of the transistors other than the transfer transistor TX, namely the reset transistor RST, the selection transistor SEL, and the amplification transistor AMI, those being shown in FIG. 3. It is possible to decrease resistance including diffusion resistance and contact resistance by forming the metallic silicide layer SIL.

Successively, as shown in FIGS. 28 and 29, a process for forming an interlayer insulating film IL1 and plugs PG over the principal surface (whole principal surface) of the semiconductor substrate SB is applied. That is, the interlayer insulating film IL1 is formed over the semiconductor substrate SB so as to cover the gate electrodes Gt and Glt, the sidewall spacer SW, and the antireflection film ARF. The interlayer insulating film IL1 can be formed by depositing a silicon oxide film over the semiconductor substrate SB by a CVD method using a TEOS (Tetra Ethyl Ortho Silicate) gas as the material gas for example. Here, in the pixel region 1A, the interlayer insulating film IL1 is formed over the silicide block film PRO.

It is also possible to flatten the surface (top face) of the interlayer insulating film IL1 by polishing the top face of the interlayer insulating film IL1 by a CMP (Chemical Mechanical Polishing) method after the interlayer insulating film IL1 is formed. Even when unevenness is formed over the surface of the interlayer insulating film IL1 due to substrate unevenness at the stage of forming the interlayer insulating film IL1, it is possible to obtain the interlayer insulating film IL1 having a flattened surface by polishing the surface of the interlayer insulating film IL1 by a CMP method after the film is formed.

Successively, contact holes (through holes, holes, or openings) CT are formed in the interlayer insulating film IL1 by dry-etching the interlayer insulating film IL1 with a photoresist pattern (not shown in the figure) formed over the interlayer insulating film IL1 used as an etching mask.

The contact holes CT are formed so as to pass through the interlayer insulating film IL1. The contact holes CT are formed over the n-type semiconductor region NR, the $n^+$-type semiconductor region SD, and other regions for example. At the bottom of the contact hole CT formed over the n-type semiconductor region NR, a part of the surface of the n-type semiconductor region NR is exposed. Then at the bottoms of the contact holes CT formed over the $n^+$-type semiconductor region SD, parts of the metallic silicide layer SIL formed over the surface of the $n^+$-type semiconductor region SD are exposed. Further, although they are not shown in the figure, contact holes CT are formed also over the gate electrodes Gt and Glt and contact holes CT are formed also over the gate electrodes (Gr, Gs, and Ga) and the source/drain regions of the other transistors shown earlier in FIG. 3, namely the reset transistor RST, the selection transistor SEL, and the amplification transistor AMI.

Successively, an electrically conductive plug PG including tungsten (W) or the like is formed as an electrical conductor section for coupling in each of the contact holes CT. For example, the plug PG can be formed as follows.

In order to form a plug PG, firstly a barrier conductive film is formed over the interlayer insulating film IL1 including the interior (bottom face and inner wall) of a contact hole CT. The barrier conductive film includes a laminated film of a titanium film and a titanium nitride film formed over the titanium film (namely titanium/titanium nitride film) and can be formed by a sputtering method or the like for example. Then a principal conductive film including a tungsten film or the like is formed over the barrier conductive film so as to fill the contact hole CT by a CVD method or the like. Successively, the unnecessary principal conductive film and barrier conductive film outside the contact hole CT (over the interlayer insulating film IL1) are removed by a CMP method, an etch back method, or the like. As a result, the top face of the interlayer insulating film IL1 is exposed and the plug PG includes the barrier conductive film and the principal conductive film, those being embedded into the contact hole CT in the interlayer insulating film IL1 and remaining. Here, in FIGS. 28 and 29, the barrier conductive film and the principal conductive film constituting the plug PG are integrated in order to simplify the figures.

As the plugs PG, there are the plugs Pr1, Pr2, Pg, Pfd, Pa, Ps, Prg, Ptg, Pag, Psg, Pt1, and Pt2. Among those, the plug Pfg is embedded into the contact hole CT formed over the n-type semiconductor region NR, passes through the interlayer insulating film IL1 and reaches the n-type semiconductor region NR, and is coupled electrically to the n-type semiconductor region NR. Further, each of the plugs Pt1 and Pt2 is embedded into each of the contact holes CT formed over the $n^+$-type semiconductor region SD, passes through the interlayer insulating film IL1 and reaches the metallic silicide layer SIL, and is coupled electrically to the $n^+$-type semiconductor region SD.

Successively, as shown in FIGS. 6 and 7, processes for forming interlayer insulating films IL2 to IL4 and wires M1 to M3 over the interlayer insulating film IL1 into which the plugs PG are embedded are applied.

For example, a laminated film of a silicon nitride film and a silicon oxide film formed over the silicon nitride film is formed as an interlayer insulating film IL2 over the interlayer insulating film IL1 by a CVD method or the like and then a wiring gutter is formed in the laminated film by a photolithography technology and a dry etching technology. Successively, a barrier conductive film is formed over the interlayer insulating film IL2 including the interior (bottom face and inner wall) of the wiring gutter. The barrier conductive film includes a laminated film of a tantalum (Ta) film and a tantalum nitride (TaN) film formed over the tantalum film and can be formed by a sputtering method or the like for example. Successively, a thin copper film is deposited as a seed film over the barrier conductive film by a sputtering method or the like, then a copper-plated film is deposited as a principal conductive film over the seed film by an electrolytic plating method, and the copper-plated film is embedded into the interior of the wiring gutter. Successively, the unnecessary copper-plated film, seed film, and barrier conductive film on the exterior of the wiring gutter (over the interlayer insulating film IL2) are removed by a CMP method or the like and a wire M1 as a first layer using copper as the main electrically conductive material is formed in the wiring gutter accordingly. Here, in FIGS. 6 and 7, the copper-plated film, the seed layer, and the barrier conductive film, those constituting the wire M1, are shown integrally. In this way, it is possible to form the wire M1 by embedding the barrier film, the seed film, and the copper-plated film into the interior of the wiring gutter.

Further likewise, as shown in FIGS. 6 and 7, an interlayer insulating film IL3 is formed over the interlayer insulating film IL2 in which the wire M1 is formed, a wire M2 is formed in the interlayer insulating film IL3, an interlayer insulating film IL4 is formed over the interlayer insulating film IL3 in which the wire M2 is formed, and a wire M3 is formed in the interlayer insulating film IL4. Although the wire M1 is formed by a single damascene method, the wires M2 and M3 can be formed by a single damascene method or a dual damascene method.

Meanwhile, a via section that is located between the wire M2 and the wire M1 and couples the wire M2 to the wire M1 is also formed in the interlayer insulating film IL3 and a via section that is located between the wire M3 and the wire M2 and couples the wire M3 to the wire M2 is formed likewise in the interlayer insulating film IL4. In the case of forming the wire M2 by a dual damascene method, the via section to couple the wire M2 to the wire M1 is formed integrally with the wire M2 together with the wire M2 but, in the case of forming the wire M2 by a single damascene method, the via section to couple the wire M2 to the wire M1 is formed separately from the wire M2. Likewise, in the case of forming the wire M3 by a dual damascene method, the via section to couple the wire M3 to the wire M2 is formed integrally with the wire M3 together with the wire M3 but, in the case of forming the wire M3 by a single damascene method, the via section to couple the wire M3 to the wire M2 is formed separately from the wire M3.

Successively, as shown in FIG. 6, a microlens ML as an on-chip lens is attached over the interlayer insulating film IL4 that is the uppermost layer so as to overlap with the n-type semiconductor region NW constituting the photodiode PD in a planar view. Here, a color filter may be installed between the microlens ML and the interlayer insulating film IL4. Further, if unnecessary, the attachment of the microlens ML may be omitted.

Through the above processes, a semiconductor device according to the present embodiment can be manufactured.

<With Regard to Problems in the Present Embodiment>

In a solid-state image sensing device, a solid-state image sensing device using a CMOS (CMOS image sensor) has been developed. The CMOS image sensor includes a plurality of pixels and each of the pixels has a photodiode and a transfer transistor. Further, the photodiode has a p-type semiconductor region and an n-type semiconductor region, the transfer transistor includes a gate electrode and an n-type semiconductor region constituting a source region and a drain region, and the n-type semiconductor region of the photodiode shares with the n-type semiconductor region that is the source region of the transfer transistor. Furthermore, the n-type semiconductor region that is the drain region of the transfer transistor is called a floating diffusion.

The phenomenon called a dark-time white spot or a dark-time white defect that causes wrong lightening (a white spot) as if a pixel is irradiated with light in spite of the fact that the pixel is not irradiated with light has been studied in a CMOS image sensor. For example, the phenomenon of forming an emission level caused by an impurity metal and generating a dark current when the impurity metal or the like exists in a p-type semiconductor region and an n-type semiconductor region constituting a photodiode has been known.

According to the studies by the present inventors, it has been found that a floating diffusion causes a dark-time white spot or a dark-time white defect to increase. Specifically, after a sidewall spacer is formed over the sidewall of the gate electrode of a transfer transistor on the drain region side, an n-type semiconductor region that is to be a floating diffusion is formed and the sidewall spacer is formed by applying anisotropic etching to an insulating film. The anisotropic etching is applied while an etching gas containing carbon (C) and fluorine (F) is used and an RF bias is applied to a semiconductor wafer where a CMOS image sensor is formed. The present inventors have thought as follows. Carbon (C) or fluorine (F) ionized in a plasma atmosphere of anisotropic etching is driven into a semiconductor substrate by the influence of an RF bias and a damaged layer is formed. The damaged layer functions as a negative fixed charge layer, supplies electric charge to a floating diffusion, and thus causes a dark-time white spot or a dark-time white defect to increase.

Further, in the anisotropic etching, over-etching to continue etching for a prescribed period of time even when the surface of a semiconductor substrate is exposed is applied so that an insulating film may not remain over the surface of the semiconductor substrate in a floating diffusion forming region and it is estimated that the damaged layer is formed particularly conspicuously at the stage of the over-etching.

Furthermore, at the process for forming a sidewall spacer, anisotropic etching is applied to an insulating film in the state of covering the source side with a photoresist pattern in order to leave the insulating film that is to be an antireflection film on the source region side of a transfer transistor. The present inventors think that impurities such as Na, K, Mg, Ca, Fe, Cu, Mn, Cr, Ni, Al, Li, Sn, S, or I are contained in a photoresist film constituting the photoresist pattern and the fact that the impurities are driven into the interior of a semiconductor substrate causes a damaged layer to be formed in the anisotropic etching. That is, a damaged layer is formed in a semiconductor substrate by sputtering a photoresist film during anisotropic etching, thus discharging impurities into a plasma atmosphere, ionizing the impurities, and thus driving the ionized impurities into the interior of the semiconductor substrate.

In addition, the present inventors have clarified through the studies that a damaged layer is formed up to a depth of about 2 nm from the surface of a semiconductor substrate.

<With Regard to Main Features and Effects in the Present Embodiment>

Then in the present embodiment, a sidewall spacer SW is formed over a sidewall of a gate electrode Gt on a floating diffusion FD side by applying anisotropic etching using an etching gas containing carbon (C) or fluorine (F) to an insulating film ZM covering the gate electrode Gt of a transfer transistor TX. Successively, a damaged layer formed in the interior of a semiconductor substrate SB during anisotropic etching is removed by oxidizing the surface of the semiconductor substrate SB in a floating diffusion FD forming region, forming a sacrificial oxide film SOX, and removing the sacrificial oxide film SOX. As a result, it is possible to remove a damaged layer caused by carbon (C) or fluorine (F), reduce a dark-time white spot or a dark-time white defect of a CMOS image sensor, and improve the performance of a semiconductor device having a photodiode.

Further, a sidewall spacer SW is formed over the sidewall of a gate electrode Gt on a floating diffusion FD side by applying anisotropic etching to an insulating film ZM in the state of forming a photoresist pattern RS4 covering the source side of a transfer transistor TX over the insulating film ZM covering the gate electrode Gt of the transfer transistor TX. Successively, a damaged layer formed in the interior of a semiconductor substrate SB during the anisotropic etching is removed by oxidizing the surface of the semiconductor substrate SB in a floating diffusion FD forming region, forming a sacrificial oxide film SOX, and removing the sacrificial oxide film SOX. As a result, it is possible to remove a damaged layer caused by impurities contained in a photoresist film constituting a photoresist pattern RS4, reduce a dark-time white spot or a dark-time white defect of a CMOS image sensor, and improve the performance of a semiconductor device having a photodiode.

That is, after a semiconductor substrate SB is oxidized to such a depth that a damaged layer is included and the damaged layer is taken into a sacrificial oxide film SOX, the damaged layer is removed together with the sacrificial oxide film SOX. Since a damaged layer is removed by oxidizing the surface of a semiconductor substrate SB up to a prescribed depth and thus forming a sacrificial oxide film SOX and removing the sacrificial oxide film SOX, it is possible to completely remove the damaged layer of such a depth that the damaged layer cannot be removed by chemical cleaning.

Further, a damaged layer is removed completely by controlling the thickness of a sacrificial oxide film SOX to 2 to 5 nm that exceeds the depth of the damaged layer whereas the depth of the damaged layer is 2 nm from the surface.

It is possible to materialize the high integration of a semiconductor device since the diffusion of an already formed semiconductor region (for example, an n-type semiconductor region NW, a $p^+$-type semiconductor region PR, or an $n^-$-type semiconductor region NM) can be reduced by forming a sacrificial oxide film SOX at a low temperature of 400° C. or lower. Further, it is possible to improve the performance of a peripheral transistor LT since it is unnecessary to increase the gate length of a gate electrode Glt of the peripheral transistor LT.

Furthermore, it is possible to obtain the same effects as the aforementioned effects and materialize a higher integration by forming a sacrificial oxide film SOX by a low-temperature radical oxidization method or a microwave heating method.

In addition, it is possible to remove a sacrificial oxide film SOX without giving a damage to the surface of a semiconductor substrate SB by removing the sacrificial oxide film SOX by a wet etching method.

Anisotropic etching is applied to a silicide block film PRO in order to expose a peripheral circuit region 2A in the state of covering a floating diffusion FD of a transfer transistor TX with the silicide block film PRO. Since the floating diffusion FD is covered with the silicide block film PRO, a damaged layer caused by carbon (C) or fluorine (F) is never formed in the interior of a semiconductor substrate SB in a floating diffusion FD forming region even when an etching gas containing carbon (C) or fluorine (F) is used during the anisotropic etching.

Further, since a floating diffusion FD is covered with a silicide block film PRO, a damaged layer caused by impurities contained in a photoresist film is never formed in the interior of a semiconductor substrate SB in a floating diffusion FD forming region even when anisotropic etching is applied in the state where a photoresist pattern RS5 exists over the semiconductor substrate SB.

Embodiment 2

In Embodiment 1 stated above, explanations have been made on the basis of the case where a semiconductor device is a surface irradiation type image sensor that receives light from the surface side of a semiconductor substrate. In Embodiment 2 in contrast, explanations will be made on the basis of the case where a semiconductor device is a back surface irradiation type image sensor that receives light from the back surface side of a semiconductor substrate.

For example, in the case of a surface irradiation type image sensor (corresponding to a semiconductor device according to Embodiment 1), the light entering a microlens (ML) passes through interlayer insulating films (IL1 to IL4) and is emitted to a photodiode (PD). Wires (M1 to M3) are not formed at the parts of the interlayer insulating films (IL1 to IL4) located above the photodiode (PD) and the parts constitute the region of light transmission but the area of the light transmission region reduces in proportion to the increase of the number and the downsizing of the pixels in the image sensor and the quantity of the light entering the photodiode may reduce undesirably in the surface irradiation type image sensor.

To cope with that, a back surface irradiation type image sensor that receives light from the back surface side of a semiconductor substrate and allows the incident light to reach a photodiode efficiently is proposed. In Embodiment 2, application examples of a back surface irradiation type image sensor are explained.

The configuration of a semiconductor device and the element structure of a peripheral circuit region according to Embodiment 2 are similar to the configuration of a semiconductor device and the element structure of a peripheral circuit region according to Embodiment 1 explained in reference to FIGS. 1 to 5 and 7 shown earlier and thus the explanations thereof are omitted.

<Element Structure of Pixel Region>

Figure 32:
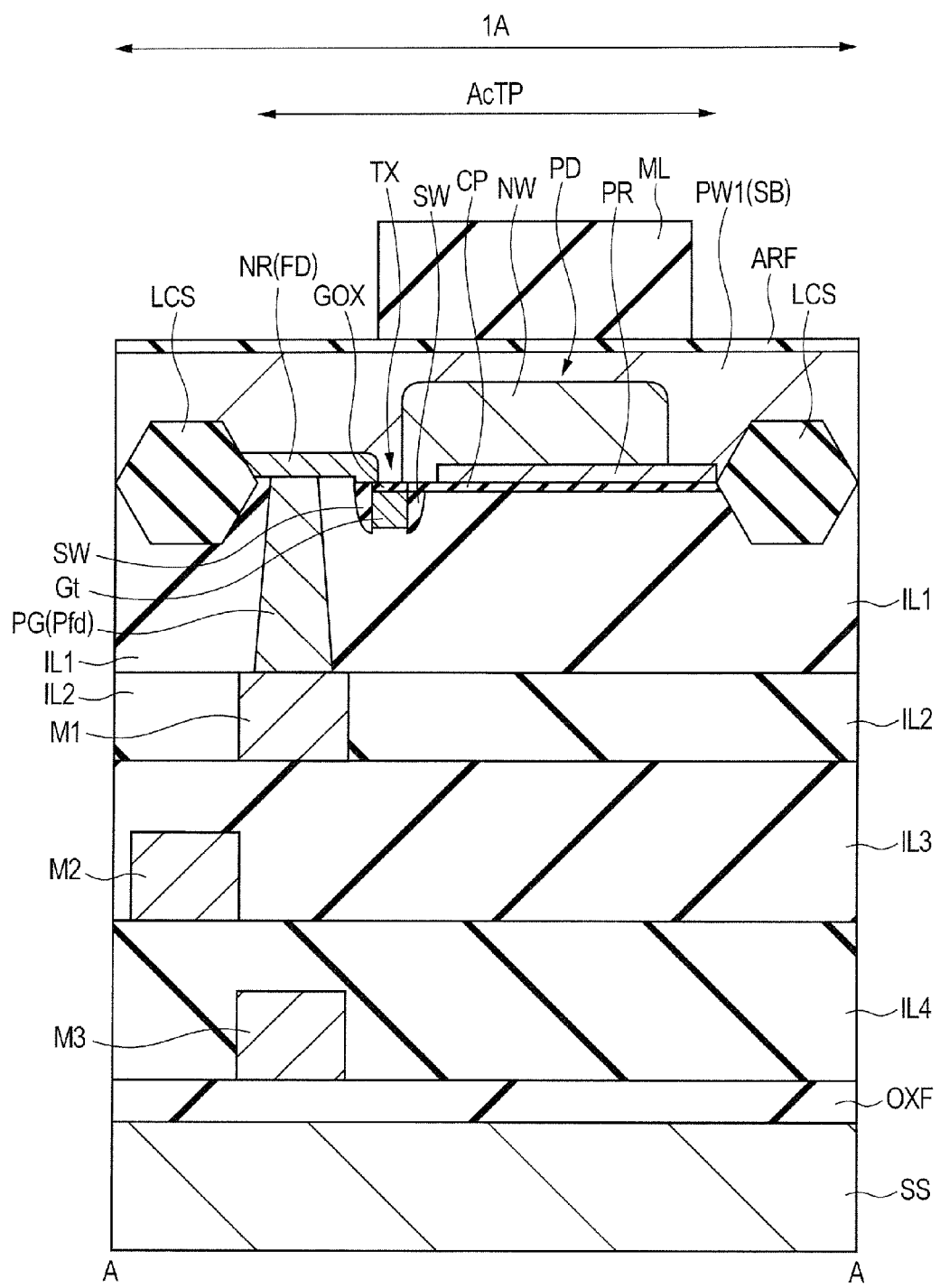
FIG. 32 is a sectional view showing a substantial part of the semiconductor device during a manufacturing process succeeding FIG. 31.

The element structure of a pixel region in a semiconductor device according to Embodiment 2 is explained hereunder. FIG. 32 is a sectional view showing a substantial part of a semiconductor device according to Embodiment 2, corresponds roughly to a sectional view taken on line A-A in FIG. 3 shown earlier, and is equivalent to FIG. 6 shown earlier according to Embodiment 1. Here, FIG. 32 is also a sectional view showing a substantial part in the manufacturing method of a semiconductor device according to Embodiment 2 that will be described later.

As shown in FIG. 32, Embodiment 2 is similar to Embodiment 1 on the points that a photodiode PD and a transfer transistor TX are formed in a semiconductor substrate SB and interlayer insulating films (IL1 to IL4) and wires (M1 to M3) are formed on the surface side (corresponding to the underside in FIG. 32) of the semiconductor substrate SB. Then in Embodiment 2 further, as shown in FIG. 32, an adhesive film OXF is formed under an interlayer insulating film (IL4) and a support substrate SS is formed under the adhesive film OXF.

Further, the thickness of a semiconductor substrate SB according to Embodiment 2 is smaller than the thickness of a semiconductor substrate SB according to Embodiment 1, also an antireflection film ARF including a silicon oxynitride film is formed over the back surface (corresponding to the surface on the upper side in FIG. 32) of the semiconductor substrate SB for example, and a microlens ML is mounted over the antireflection film ARF. Here, a $p^+$-type semiconductor region may be formed between the semiconductor substrate SB and the antireflection film ARF.

In a pixel region 1A configured in this way, when light enters a microlens ML, the light entering the microlens ML reaches the back surface of a semiconductor substrate SB through an antireflection film ARF. Then the light having reached the back surface of the semiconductor substrate SB enters the interior of the semiconductor substrate SB and is received by a photodiode PD.

<Manufacturing Method of Semiconductor Device>

Figure 30:
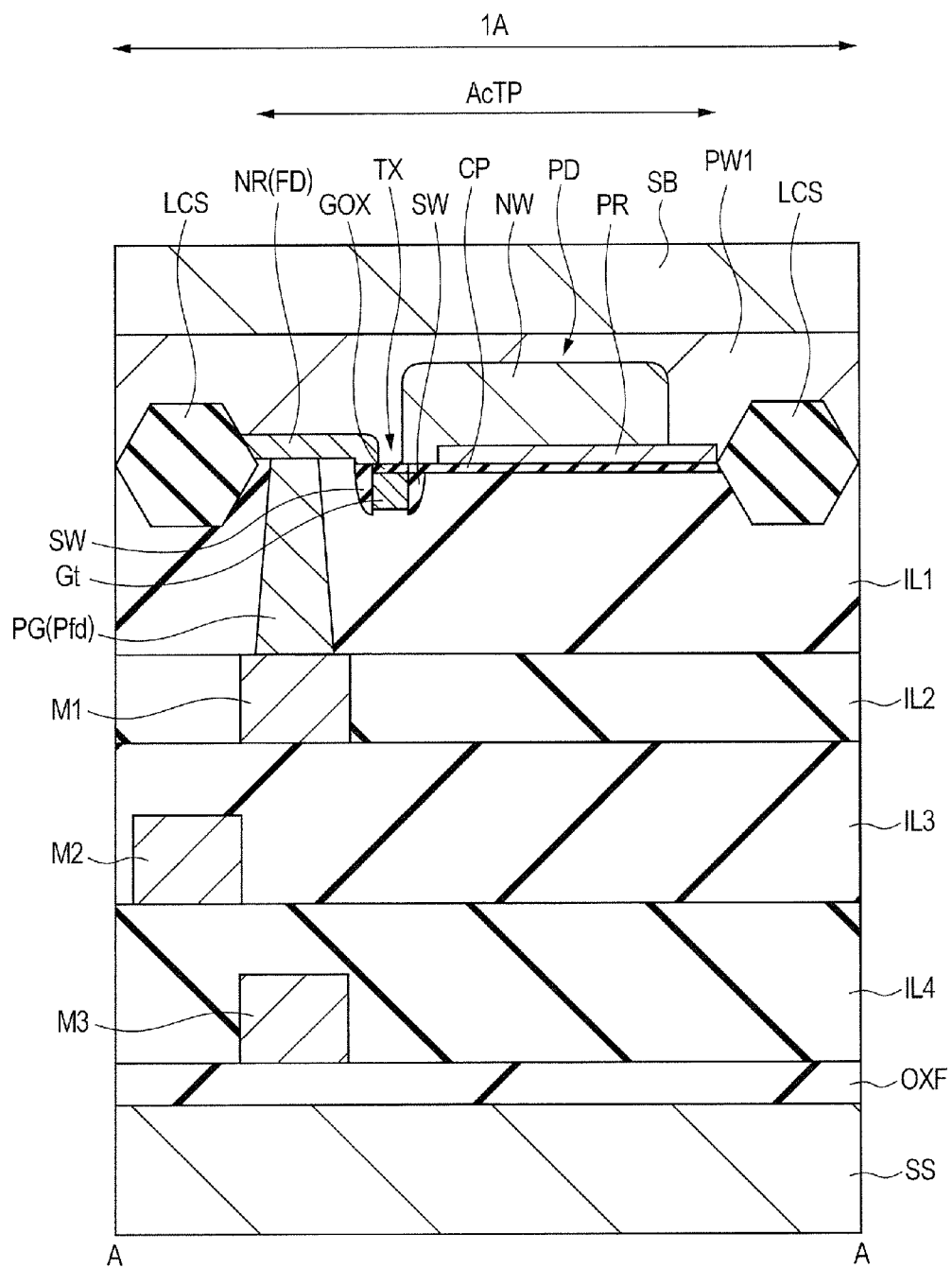
FIG. 30 is a sectional view showing a substantial part of a semiconductor device according to another embodiment during a manufacturing process.
Figure 31:
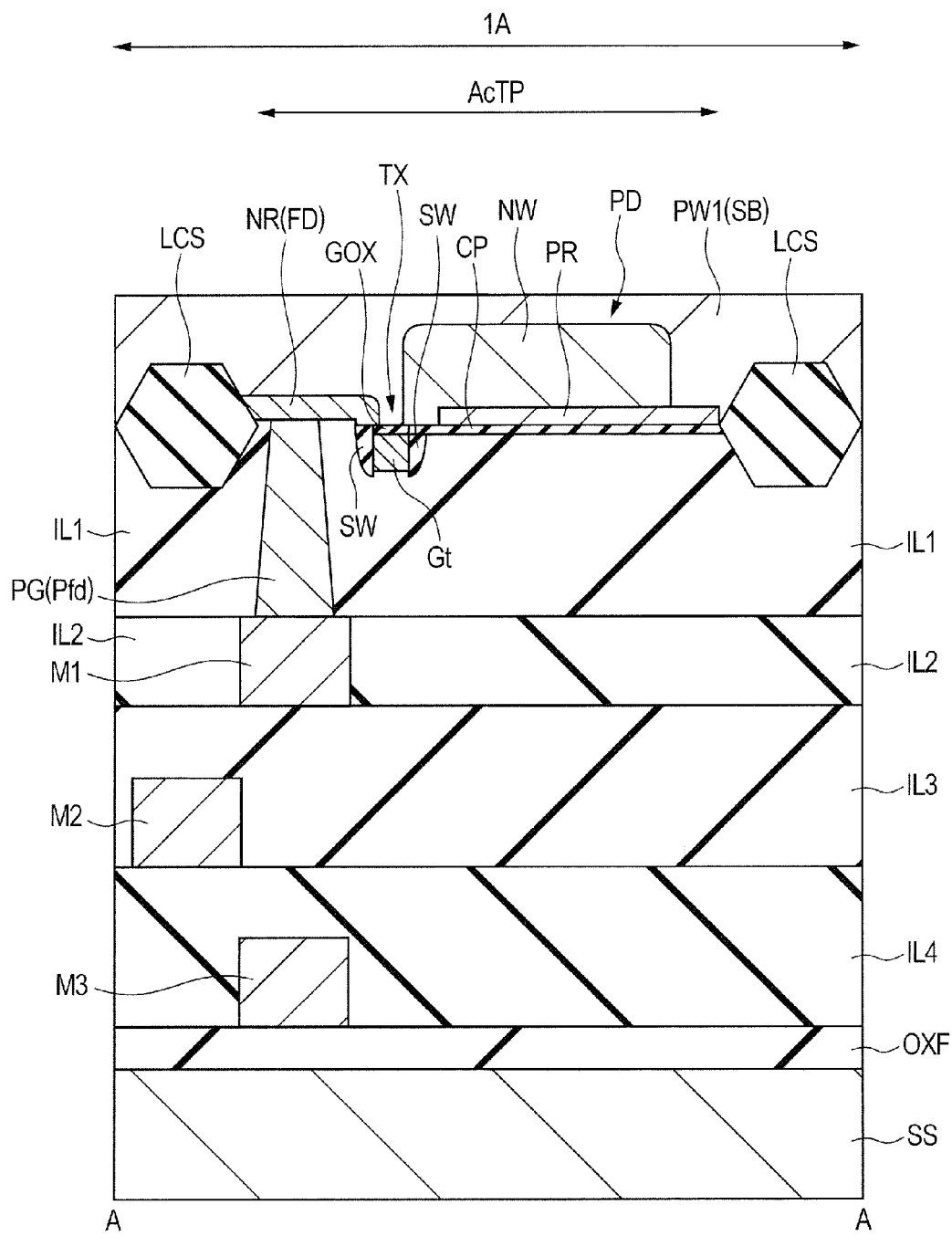
FIG. 31 is a sectional view showing a substantial part of the semiconductor device during a manufacturing process succeeding FIG. 30.

A manufacturing method of a semiconductor device according to Embodiment 2 is explained hereunder. Manufacturing processes of a pixel region are explained hereunder. FIGS. 30 to 32 are sectional views showing a substantial part of a semiconductor device according to Embodiment 2 during manufacturing processes. Here, FIGS. 30 to 32 are sectional views taken at a position corresponding to the line A-A in FIG. 3 shown earlier.

Firstly, Embodiment 2 is different from Embodiment 1 on the point that an antireflection film ARF is not formed on the principal surface side of a semiconductor substrate SB and is formed on the back surface side of the semiconductor substrate SB in Embodiment 2. A manufacturing method of a semiconductor device according to Embodiment 2 is almost the same as Embodiment 1 until a semiconductor device shown in FIGS. 6 and 7 is completed and hence only different points are explained.

Anisotropic etching is applied to an insulating film ZM in the state of covering the insulating film ZM with a photoresist pattern RS4 at a process for forming an antireflection film ARF and a sidewall spacer SW explained in reference to FIGS. 18 and 19 but, in Embodiment 2, anisotropic etching is applied to an insulating film ZM without forming a photoresist pattern RS4. As a result, sidewall spacers SW are formed over both the sidewalls of a gate electrode Gt as shown in FIG. 30. Other processes are the same as Embodiment 1.

Successively, as shown in FIG. 30, in the state of directing the surface of an interlayer insulating film IL4 in which a wire M3 is formed downward, a support substrate SS is formed over the surface of the interlayer insulating film IL4 with an adhesive film OXF including a silicon oxide film interposed for example. As a result, in the state of directing the back surface of a semiconductor substrate SB upward, a laminated structure including the semiconductor substrate SB and insulating films IL1 to IL4 is fixed to the support substrate SS. Then as shown in FIG. 31, the back surface of the semiconductor substrate SB directed upward is ground. As a result, it is possible to reduce the thickness of the semiconductor substrate SB.

Successively, as shown in FIG. 32, an antireflection film ARF including a silicon oxynitride film is formed over the back surface of the semiconductor substrate SB for example. Here, it is also possible to form a p$^+$-type semiconductor region between the semiconductor substrate SB and the antireflection film ARF by introducing p-type impurities such as boron (B) into the back surface of the semiconductor substrate SB directed upward by a photolithography technology and an ion implantation method.

Successively, as shown in FIG. 32, a microlens ML is attached over the antireflection film ARF so as to overlap with an n-type semiconductor region NW constituting a photodiode PD in a planar view. In this way, it is possible to manufacture a semiconductor device as an image sensor according to Embodiment 2.

The methods for forming a photodiode PD and transistors in Embodiment 2 are the same as those in Embodiment 1. Consequently, in Embodiment 2 too, effects similar to those explained in Embodiment 1 can be obtained.

Although the invention established by the present inventors has heretofore been explained concretely on the basis of the embodiments, it goes without saying that the present invention is not limited to the embodiments and can be modified variously within the scope not departing from the tenor of the present invention.

What is claimed is:

1. A manufacturing method of a semiconductor device having a photodiode and a transfer transistor,
the manufacturing method comprising:
(a) providing a semiconductor substrate having a principal surface,
(b) forming a p-type first semiconductor region in an interior of the semiconductor substrate,
(c) forming a gate electrode having a first sidewall and a second sidewall over the principal surface of the semiconductor substrate with a gate insulating film interposed between the gate electrode and the semiconductor substrate,
(d) forming an n-type second semiconductor region in the p-type first semiconductor region on the first sidewall side of the gate electrode,
(e) forming a first insulating film so as to cover the gate electrode and the principal surface of the semiconductor substrate,
(f) applying anisotropic etching to the first insulating film and forming a sidewall spacer over the second sidewall of the gate electrode,
(g) after (f), forming an oxide film by oxidizing the principal surface of the semiconductor substrate on the second sidewall side of the gate electrode,
(h) removing the oxide film, and
(i) forming an n-type third semiconductor region in the p-type first semiconductor region on the second sidewall side of the gate electrode;
wherein the photodiode includes the first semiconductor region and the second semiconductor region, and
wherein the transfer transistor includes the gate electrode, the second semiconductor region, and the third semiconductor region.

2. A manufacturing method of a semiconductor device according to claim 1,
wherein, in (f), the anisotropic etching is applied by using an etching gas containing carbon or fluorine.

3. A manufacturing method of a semiconductor device according to claim 2,
wherein, in (f), the anisotropic etching is applied in a state of applying an RF bias to the semiconductor substrate.

4. A manufacturing method of a semiconductor device according to claim 3, wherein the first insulating film includes a silicon nitride film or a silicon oxynitride film.

5. A manufacturing method of a semiconductor device according to claim 1,
wherein, in (f), a photoresist pattern is formed over the first insulating film so as to cover a region where the second semiconductor region is formed.

6. A manufacturing method of a semiconductor device according to claim 5,
wherein the photoresist pattern includes a photoresist film.

7. A manufacturing method of a semiconductor device according to claim 6,
wherein impurities, including Na, K, Mg, Ca, Fe, Cu, Mn, Cr, Ni, Al, Li, Sn, S, or I, are contained in the photoresist film.

8. A manufacturing method of a semiconductor device according to claim 1, wherein,
in (h), the oxide film is removed by a wet etching method.

9. A manufacturing method of a semiconductor device according to claim 1, further comprising:
(j) after (d), forming a p-type fourth semiconductor region in the p-type first semiconductor region on the first sidewall side of the gate electrode,
wherein the fourth semiconductor region is shallower than the second semiconductor region.

10. A manufacturing method of a semiconductor device according to claim 1, wherein the forming the n-type second semiconductor region of (d) is after the forming the gate electrode of (c).

11. A manufacturing method of a semiconductor device having a pixel region where a photodiode and a transfer transistor are arranged and a peripheral circuit region where a peripheral transistor is arranged, the manufacturing method comprising:
(a) providing a semiconductor substrate having the pixel region and the peripheral circuit region over a principal surface of the semiconductor substrate,
(b) forming a p-type first semiconductor region in an interior of the semiconductor substrate in the pixel region and a p-type second semiconductor region in the interior of the semiconductor substrate in the peripheral circuit region,
(c) forming a first gate electrode having a first sidewall and a second sidewall over the principal surface of the semiconductor substrate in the pixel region, with a first gate insulating film interposed between the first gate electrode and the semiconductor substrate, and a second gate electrode having a third sidewall and a fourth sidewall over the principal surface of the semiconductor substrate in the peripheral circuit region, with a second gate insulating film interposed between the second gate electrode and the semiconductor substrate,
(d) forming an n-type third semiconductor region in the first semiconductor region on the first sidewall side of the first gate electrode,
(e) forming a pair of n-type fourth semiconductor regions in the second semiconductor region on the third sidewall side and the fourth sidewall side, respectively, of the second gate electrode,
(f) forming a first insulating film so as to cover the first gate electrode, the second gate electrode, and the principal surface of the semiconductor substrate,
(g) applying first anisotropic etching to the first insulating film and forming a first sidewall spacer over the second sidewall of the first gate electrode and a pair of second sidewall spacers over the third sidewall and the fourth sidewall, respectively, of the second gate electrode,
(h) after (g), forming an oxide film by oxidizing the principal surface of the semiconductor substrate on the second sidewall side of the first gate electrode,
(i) removing the oxide film, and
(j) forming an n-type fifth semiconductor region in the first semiconductor region on the second sidewall side of the first gate electrode and a pair of n-type sixth semiconductor regions in the second semiconductor region on the third sidewall side and the fourth sidewall side, respectively, of the second gate electrode;
wherein the photodiode includes the first semiconductor region and the third semiconductor region;
wherein the transfer transistor includes the first gate electrode, the third semiconductor region, and the fifth semiconductor region; and
wherein the peripheral transistor includes the second gate electrode and the paired sixth semiconductor region.

12. A manufacturing method of a semiconductor device according to claim 11,
wherein, in (g), the first anisotropic etching is applied by using an etching gas containing carbon or fluorine.

13. A manufacturing method of a semiconductor device according to claim 12,
wherein, in (g), the first anisotropic etching is applied in the state of applying an RF bias to the semiconductor substrate.

14. A manufacturing method of a semiconductor device according to claim 13,
wherein the first insulating film includes a silicon nitride film or a silicon oxynitride film.

15. A manufacturing method of a semiconductor device according to claim 11,
wherein, in (g), a first photoresist pattern is formed over the first insulating film so as to cover a region where the third semiconductor region is formed.

16. A manufacturing method of a semiconductor device according to claim 14,
wherein the first photoresist pattern includes a photoresist film, and
wherein impurities, including Na, K, Mg, Ca, Fe, Cu, Mn, Cr, Ni, Al, Li, Sn, S, or I, are contained in the photoresist film.

17. A manufacturing method of a semiconductor device according to claim 11,
wherein, in (i), the oxide film is removed by a wet etching method.

18. A manufacturing method of a semiconductor device according to claim 11, further comprising:
(k) after (d), forming a p-type seventh semiconductor region in the first semiconductor region on the first sidewall side of the first gate electrode,
wherein the seventh semiconductor region is shallower than the third semiconductor region.

19. A manufacturing method of a semiconductor device according to claim 11, further comprising:
(l) forming a second insulating film so as to cover the first gate electrode, the first sidewall spacer, the second gate electrode, the second sidewall spacer, and the principal surface of the semiconductor substrate,
(m) forming a second photoresist pattern over the second insulating film so as to cover a region where the fifth semiconductor region is formed in the pixel region,
(n) after (m), applying second anisotropic etching to the second insulating film and exposing surfaces of the pair of sixth semiconductor regions, and
(o) forming a silicide film over the surface of the pair of sixth semiconductor regions.

20. A manufacturing method of a semiconductor device according to claim 19,
wherein, in (o), a surface of the semiconductor substrate where the fifth semiconductor region is formed is covered with the second insulating film.

* * * * *